United States Patent
Saida et al.

(10) Patent No.: US 8,582,355 B2
(45) Date of Patent: Nov. 12, 2013

(54) MAGNETIC MEMORY ELEMENT AND NONVOLATILE MEMORY DEVICE

(75) Inventors: Daisuke Saida, Tokyo (JP); Minoru Amano, Kanagawa-ken (JP); Junichi Ito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 13/416,408

(22) Filed: Mar. 9, 2012

(65) Prior Publication Data

US 2013/0070523 A1 Mar. 21, 2013

(30) Foreign Application Priority Data

Sep. 21, 2011 (JP) .................................. 2011-206661

(51) Int. Cl.
 *G11C 11/15* (2006.01)
 *G11C 11/16* (2006.01)
(52) U.S. Cl.
 CPC ..................................... *G11C 11/16* (2013.01)
 USPC ........... 365/173; 365/158; 365/171; 365/100; 365/148
(58) Field of Classification Search
 CPC ............... G11C 11/16; G11C 11/5607; G11C 2213/79; G11C 19/0808
 USPC .......................... 365/158, 171, 173, 100, 148
 See application file for complete search history.

(56) References Cited

U.S. PATENT DOCUMENTS

| | | | |
|---|---|---|---|
| 6,956,766 B2 * | 10/2005 | Nakamura et al. ............. | 365/171 |
| 8,077,509 B2 | 12/2011 | Yanagi et al. | |
| 8,085,582 B2 | 12/2011 | Nakamura et al. | |

FOREIGN PATENT DOCUMENTS

JP 2009-21352 1/2009

OTHER PUBLICATIONS

U.S. Appl. No. 13/228,040, filed Sep. 8, 2011, Daisuke Saida, et al.
U.S. Appl. No. 13/227,959, filed Sep. 8, 2011, Daisuke Saida, et al.
U.S. Appl. No. 13/210,678, filed Aug. 16, 2011, Tadaomi Daibou, et al.
U.S. Appl. No. 13/037,592, filed Mar. 1, 2011, Daisuke Saida, et al.
U.S. Appl. No. 13/795,620, filed Mar. 12, 2013, Saida, et al.
U.S. Appl. No. 13/601,343, filed Aug. 31, 2012, Saida, et al.

* cited by examiner

*Primary Examiner* — Thong Q Le
(74) *Attorney, Agent, or Firm* — Oblon, Spivak, McClelland, Maier & Neustadt, L.L.P.

(57) ABSTRACT

According to one embodiment, a magnetic memory element includes a stacked body including first and second stacked units. The first stacked unit includes first and second ferromagnetic layers and a first nonmagnetic layer. A magnetization of the first ferromagnetic layer is fixed in a direction perpendicular to the first ferromagnetic layer. A magnetization of the second ferromagnetic layer is variable. The first nonmagnetic layer is provided between the first and second ferromagnetic layers. The second stacked unit stacked with the first stacked unit includes third and fourth ferromagnetic layers and a second nonmagnetic layer. A magnetization of the third ferromagnetic layer is variable. The fourth ferromagnetic layer is stacked with the third ferromagnetic layer. A magnetization of the fourth ferromagnetic layer is fixed in a direction perpendicular to the fourth ferromagnetic layer. The second nonmagnetic layer is provided between the third and fourth ferromagnetic layers.

20 Claims, 7 Drawing Sheets

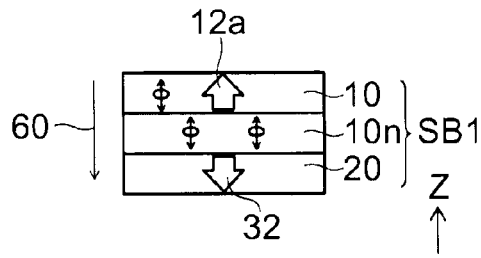 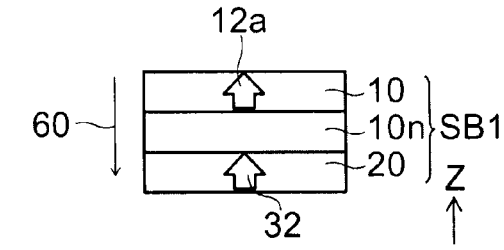
FIG. 3A    FIG. 3B
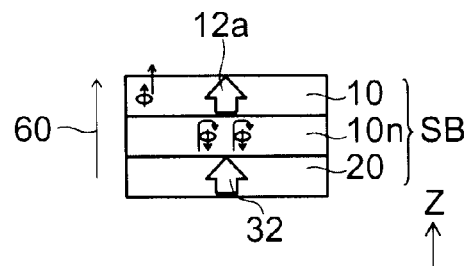 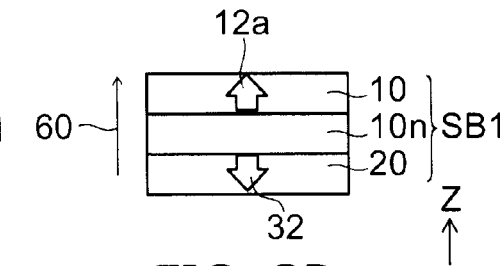
FIG. 3C    FIG. 3D
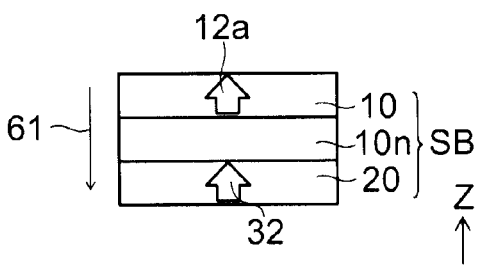 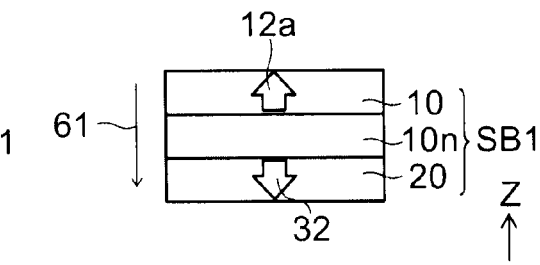
FIG. 4A    FIG. 4B
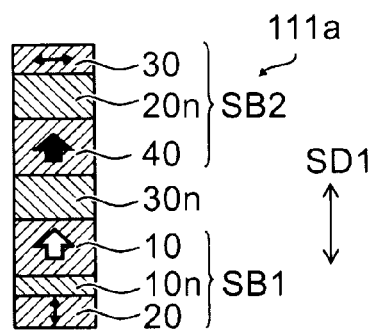 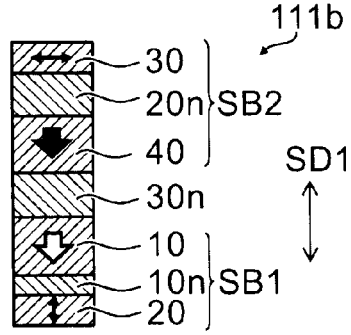
FIG. 5A    FIG. 5B

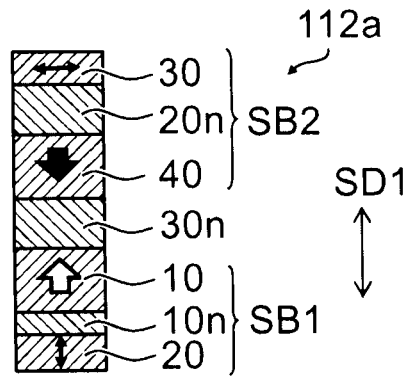
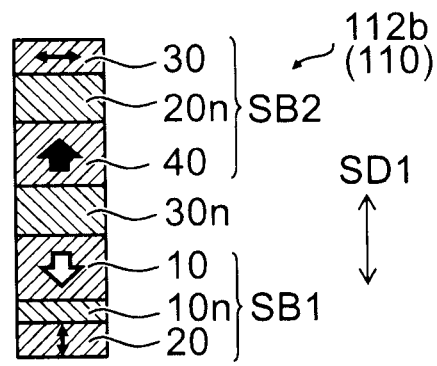
FIG. 6A FIG. 6B
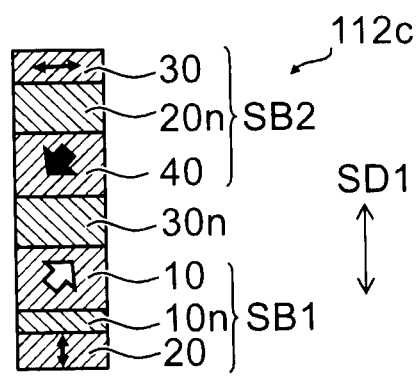
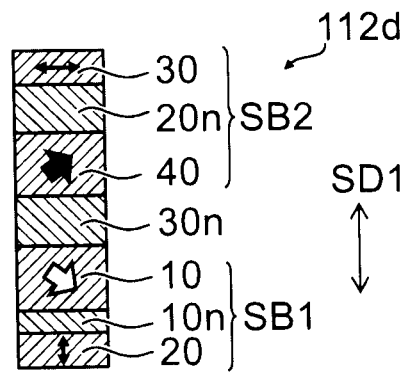
FIG. 7A FIG. 7B
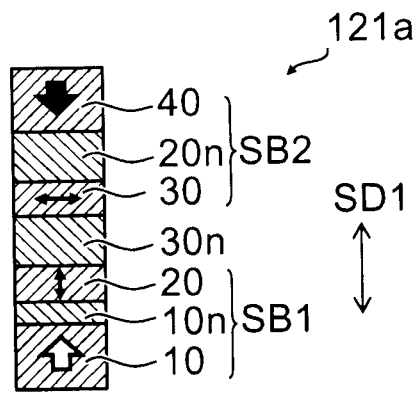
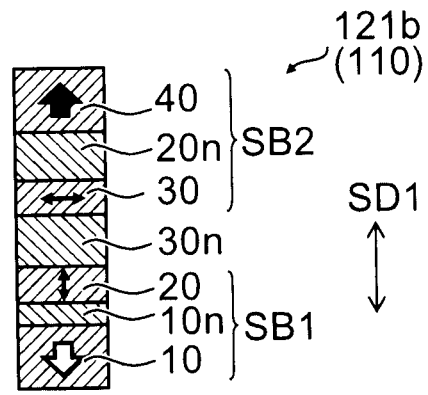
FIG. 8A FIG. 8B

MAGNETIC MEMORY ELEMENT AND NONVOLATILE MEMORY DEVICE

CROSS-REFERENCE TO RELATED APPLICATIONS

This application is based upon and claims the benefit of priority from the prior Japanese Patent Application No. 2011-206661, filed on Sep. 21, 2011; the entire contents of which are incorporated herein by reference.

FIELD

Embodiments described herein relate generally to a magnetic memory element and a nonvolatile memory device.

BACKGROUND

Some magnetic random access memories (MRAM) have a configuration in which a magnetic tunnel junction (MTJ) element exhibiting the tunneling magnetoresistive (TMR) effect is used for a data memory unit. The configuration is drawing attention as a high-speed and large-capacity nonvolatile memory. Writing to the memory layer of the MTJ element is performed by, for example, a spin-transfer torque writing system. In the system, for example, a current is passed directly through the MTJ element and a spin-transfer torque injected from the reference layer of the MTJ element is used to reverse the magnetization of the memory layer. It is important to ensure stable operation in such a magnetic memory element.

BRIEF DESCRIPTION OF THE DRAWINGS

FIG. 3A to FIG. 3D are schematic views illustrating an operation of the magnetic memory element according to the embodiment;

FIG. 4A and FIG. 4B are schematic views illustrating an operation of the magnetic memory element according to the embodiment;

FIG. 5A and FIG. 5B are schematic cross-sectional views illustrating the configurations of other magnetic memory elements according to the first embodiment;

FIG. 6A and FIG. 6B are schematic cross-sectional views illustrating the configurations of other magnetic memory elements according to the first embodiment;

FIG. 7A and FIG. 7B are schematic cross-sectional views illustrating the configurations of other magnetic memory elements according to the first embodiment;

FIG. 8A and FIG. 8B are schematic cross-sectional views illustrating the configurations of other magnetic memory elements according to the first embodiment;

DETAILED DESCRIPTION

Figure 1:
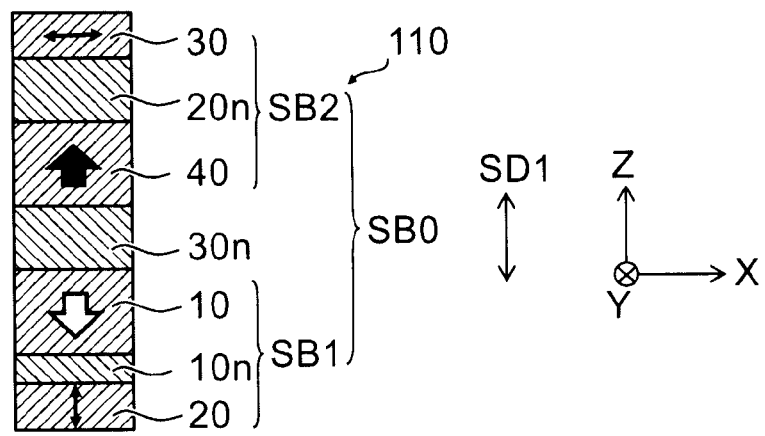
FIG. 1 is a schematic cross-sectional view illustrating the configuration of a magnetic memory element according to a first embodiment.

According to one embodiment, a magnetic memory element includes a stacked body including a first stacked unit and a second stacked unit. The first stacked unit includes a first ferromagnetic layer, a second ferromagnetic layer and a first nonmagnetic layer. A magnetization of the first ferromagnetic layer is fixed in a first direction having a component perpendicular to a film surface of the first ferromagnetic layer. The second ferromagnetic layer is stacked with the first ferromagnetic layer along a stacking direction. A direction of a magnetization of the second ferromagnetic layer is variable in directions perpendicular to a film surface of the second ferromagnetic layer. The first nonmagnetic layer is provided between the first ferromagnetic layer and the second ferromagnetic layer. The second stacked unit is stacked with the first stacked unit along the stacking direction. The second stacked unit includes a third ferromagnetic layer, a fourth ferromagnetic layer and a second nonmagnetic layer. A direction of a magnetization of the third ferromagnetic layer is variable in directions parallel to a film surface of the third ferromagnetic layer. The fourth ferromagnetic layer is stacked with the third ferromagnetic layer along the stacking direction. A magnetization of the fourth ferromagnetic layer is fixed in a second direction having a component perpendicular to a film surface of the fourth ferromagnetic layer. The second nonmagnetic layer is provided between the third ferromagnetic layer and the fourth ferromagnetic layer. A stray magnetic field Hs (Oe) from the first ferromagnetic layer, the second ferromagnetic layer, and the fourth ferromagnetic layer in a position of the third ferromagnetic layer, a magnetic anisotropy Ku (erg/cm$^3$) of the third ferromagnetic layer, a damping coefficient α of the third ferromagnetic layer, a magnetization Ms (emu/cc) of the third ferromagnetic layer, and a demagnetic field coefficient Nz of the third ferromagnetic layer satisfy a relationship of $$K_u < \alpha M_s (8\pi N_z M_s - H_s).$$

The direction of the magnetization of the second ferromagnetic layer is set to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer.

According to another embodiment, a nonvolatile memory device includes a magnetic memory element, a first interconnection and a second interconnection. The magnetic memory element includes a stacked body including a first stacked unit and a second stacked unit. The first stacked unit includes a first ferromagnetic layer, a second ferromagnetic layer and a first nonmagnetic layer. A magnetization of the first ferromagnetic layer is fixed in a first direction having a component perpendicular to a film surface of the first ferromagnetic layer. The second ferromagnetic layer is stacked with first ferromagnetic layer along the stacking direction. A direction of a magnetization of the second ferromagnetic layer is variable in directions perpendicular to a film surface of the second ferromagnetic layer. The first nonmagnetic layer is provided between the first ferromagnetic layer and the second ferromagnetic layer. The second stacked unit is stacked with the first stacked unit along the stacking direction. The second stacked unit includes a third ferromagnetic layer, a fourth ferromagnetic layer and a second nonmagnetic layer. A direction of a magnetization of the third ferromagnetic layer is variable in directions parallel to a film surface of the third ferromagnetic layer. The fourth ferromagnetic layer is stacked with the third ferromagnetic layer along the stacking direction. A magnetization of the fourth ferromagnetic layer is fixed in a second direction having a component perpendicular to a film surface of the fourth ferromagnetic layer. The second nonmagnetic layer is provided between the third ferromagnetic layer and the fourth ferromagnetic layer. A stray magnetic field Hs (Oe) from the first ferromagnetic layer, the second ferromagnetic layer, and the fourth ferromagnetic layer in a position of the third ferromagnetic layer, a magnetic anisotropy Ku (erg/cm$^3$) of the third ferromagnetic layer, a damping coefficient $\alpha$ of the third ferromagnetic layer, a magnetization Ms (emu/cc) of the third ferromagnetic layer, and a demagnetic field coefficient Nz of the third ferromagnetic layer satisfy a relationship of $$K_u < \alpha M_s (8\pi N_z M_s - H_s).$$

The direction of the magnetization of the second ferromagnetic layer is set to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer. The first interconnection is directly or indirectly connected to one end of the magnetic memory element. The second interconnection is directly or indirectly connected to another end of the magnetic memory element. The first and second interconnections are configured to flow the current though the stacked body along the stacking direction.

Various embodiments will be described hereinafter with reference to the accompanying drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

FIG. 1 is a schematic cross-sectional view illustrating the configuration of a magnetic memory element according to a first embodiment.

As shown in FIG. 1, a magnetic memory element 110 according to the embodiment includes a stacked body SB0. The stacked body SB0 includes a first stacked unit SB1 and a second stacked unit SB2.

The first stacked unit SB1 includes a first ferromagnetic layer 10, a second ferromagnetic layer 20, and a first nonmagnetic layer 10n.

In the first ferromagnetic layer 10, the magnetization (the magnetization of the first ferromagnetic layer 10) is fixed in a first direction having a component perpendicular to the film surface. In the second ferromagnetic layer 20, the direction of the magnetization (the magnetization of the second ferromagnetic layer 20) is variable in directions perpendicular to the film surface. The first nonmagnetic layer 10n is provided between the first ferromagnetic layer 10 and the second ferromagnetic layer 20. The "film surface" is a surface parallel to the major surface of the layer and corresponds to a "layer surface."

That is, the first ferromagnetic layer 10, the second ferromagnetic layer 20, and the first nonmagnetic layer 10n are stacked. The direction (axis) along which the first ferromagnetic layer 10, the second ferromagnetic layer 20, and the first nonmagnetic layer 10n are stacked is referred to as a stacking direction SD1. The stacking direction SD1 is, for example, perpendicular to the film surface of the first ferromagnetic layer 10.

For convenience of description, an axis parallel to the stacking direction SD1 is taken as a Z-axis. One axis perpendicular to the Z-axis is taken as an X-axis. The axis perpendicular to the Z-axis and the X-axis is taken as a Y-axis.

In the specification of this application, "stack" includes not only the case where a plurality of layers are stacked in contact with each other but also the case where a plurality of layers are stacked via other components.

The second stacked unit SB2 is stacked with the first stacked unit SB1 along the stacking direction SD1. The second stacked unit SB2 includes a third ferromagnetic layer 30, a fourth ferromagnetic layer 40, and a second nonmagnetic layer 20n. In the third ferromagnetic layer 30, the direction of the magnetization (the magnetization of the third ferromagnetic layer 30) is variable in directions parallel to the film surface. The fourth ferromagnetic layer 40 is stacked with the third ferromagnetic layer 30 along the stacking direction SD1. In the fourth ferromagnetic layer 40, the magnetization (the magnetization of the fourth ferromagnetic layer 40) is fixed in a second direction having a component perpendicular to the film surface. The second nonmagnetic layer 20n is provided between the third ferromagnetic layer 30 and the fourth ferromagnetic layer 40.

That is, the third ferromagnetic layer 30, the fourth ferromagnetic layer 40, and the second nonmagnetic layer 20n are stacked with the first ferromagnetic layer 10, the second ferromagnetic layer 20, and the first nonmagnetic layer 10n along the stacking direction SD1. As described later, the order of the layers may be variously altered.

In the magnetic memory element 110, an electron whose spin is polarized by passing a current through the stacked body SB0 along the stacking direction SD1 is caused to act on the second ferromagnetic layer 20, and a rotating magnetic field generated from the precession of the magnetization of the third ferromagnetic layer 30 is caused to act on the second ferromagnetic layer 20. Thereby, the direction of the magnetization of the second ferromagnetic layer 20 can be determined to a direction in accordance with the direction of the current. The current mentioned above flows in a direction substantially perpendicular to the film surfaces of the layers of the stacked body SB0.

In the magnetic memory element 110, the second stacked unit SB2 functions as a magnetic field generation unit. The first stacked unit SB1 functions as a magnetic memory unit. Hereinafter, the second stacked unit SB2 may be referred to as the magnetic field generation unit and the first stacked unit SB1 may be referred to as the magnetic memory unit, as appropriate.

The first ferromagnetic layer 10 is, for example, a first magnetization fixed layer. In the second ferromagnetic layer 20, the magnetization easy axis is in a direction substantially perpendicular to the film surface. The second ferromagnetic layer 20 functions as a magnetic memory layer. The first nonmagnetic layer 10n functions as a first spacer layer. The first stacked unit SB1 including the first ferromagnetic layer 10, the first nonmagnetic layer 10n, and the second ferromagnetic layer 20 has a structure of, for example, MTJ (magnetic tunnel junction).

The third ferromagnetic layer 30 functions as a magnetization rotation layer. The fourth ferromagnetic layer 40 functions as a second magnetization fixed layer in which the magnetization is fixed in a direction substantially perpendicular to the film surface. The second nonmagnetic layer 20n functions as a second spacer layer.

In the magnetic memory element 110 having such a configuration, the magnetization reversal in writing takes place quickly.

FIG. 1 illustrates the cross section of the stacked body SB0 when cut along a plane parallel to the Z-axis. The shape of the stacked body SB0 (the first stacked unit SB1 and the second stacked unit SB2) when cut along a plane perpendicular to the Z-axis is, for example, a circle (including a flat circle). In the embodiment, however, the shapes of the first stacked unit SB1 and the second stacked unit SB2 when cut along a plane perpendicular to the Z-axis are arbitrary.

In the magnetic memory element 110, the stacked body SB0 further includes a third nonmagnetic layer 30n. The third nonmagnetic layer 30n is provided between the first stacked unit SB1 and the second stacked unit SB2. The third nonmagnetic layer 30n is provided as necessary and may be omitted.

A perpendicular magnetization film, for example, is used as the first ferromagnetic layer 10, the second ferromagnetic layer 20, and the fourth ferromagnetic layer 40. An in-plane magnetization film, for example, is used as the third ferromagnetic layer.

Figures 2A, 2B:
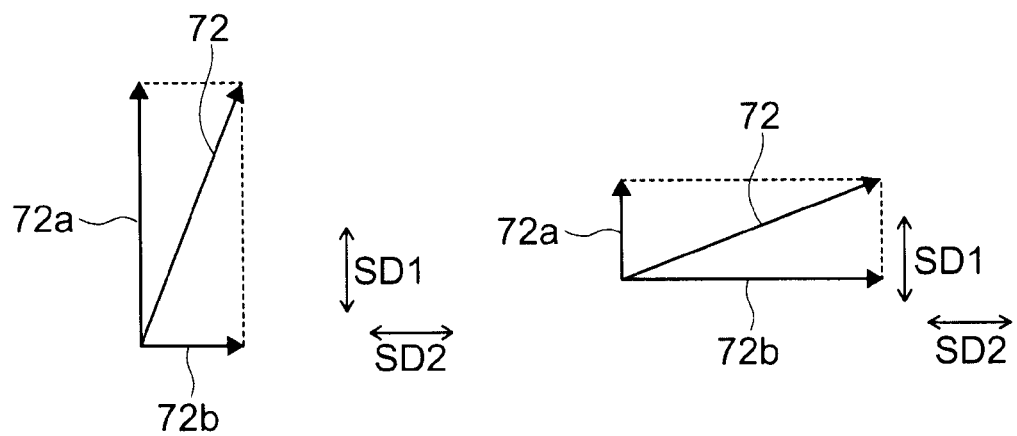
FIG. 2A and FIG. 2B are schematic views illustrating magnetization.

FIG. 2A and FIG. 2B are schematic views illustrating magnetization.

FIG. 2A illustrates the magnetization in a perpendicular magnetization film. FIG. 2B illustrates the magnetization in an in-plane magnetization film.

As shown in FIG. 2A and FIG. 2B, one axis perpendicular to the stacking direction SD1 is taken as an in-plane axis SD2. The in-plane axis SD2 is an axis in the X-Y plane. An out-of-plane magnetization component 72a is defined as to be a projection of the magnetization 72 onto the Z-axis. The out-of-plane magnetization component 72a is parallel to the stacking direction SD1. An in-plane magnetization component 72b is defined as to be a projection of the magnetization 72 onto the X-Y plane. The in-plane magnetization component 72b is parallel to the in-plane axis SD2.

As shown in FIG. 2A, the perpendicular magnetization film has a magnetization state in which the out-of-plane magnetization component 72a is larger than the in-plane magnetization component 72b. In the perpendicular magnetization film, the direction of the magnetization is preferably substantially perpendicular to the film surface in view of operating characteristics.

As shown in FIG. 2B, the in-plane magnetization film has a magnetization state in which the in-plane magnetization component 72b is larger than the out-of-plane magnetization component 72a. In the in-plane magnetization film, the direction of the magnetization is preferably substantially parallel to the film surface in view of operating characteristics.

For convenience of description, the direction from the first stacked unit SB1 toward the second stacked unit SB2 is referred to as "upward" or an "upward direction." The direction from the second stacked unit SB2 toward the first stacked unit SB1 is referred to as "downward" or a "downward direction."

As described above, the magnetization of the first ferromagnetic layer 10 is substantially fixed in the first direction. The magnetization of the fourth ferromagnetic layer 40 is substantially fixed in the second direction.

As illustrated in FIG. 1, in the magnetic memory element 110, the first direction is the downward direction, and the second direction is the upward direction. However, as described later, the first direction and the second direction may be variously altered.

In the magnetic memory element 110, for example, an electronic current can be passed through the stacked body SB0 with a pair of electrodes (not shown) provided across the stacked body SB0. The electronic current is a flow of electrons. When a current flows upward, the electronic current flows downward.

The second ferromagnetic layer 20 takes the role of storing data. The magnetization of the second ferromagnetic layer 20 can be reversed comparatively easily. The third ferromagnetic layer 30 takes the role of generating a high frequency magnetic field in writing.

When an electronic current is passed in the direction perpendicular to the film surface, the magnetization in the third ferromagnetic layer 30 of the magnetic field generation unit precesses. Thereby, a rotating magnetic field (a high frequency magnetic field) is generated. The frequency of the high frequency magnetic field is, for example, about 1 GHz to 60 GHz. The high frequency magnetic field has a component in a direction perpendicular to the magnetization of the second ferromagnetic layer 20 (a component in the direction of the magnetization hard axis of the second ferromagnetic layer 20). Therefore, at least part of the high frequency magnetic field generated from the third ferromagnetic layer 30 is applied in the direction of the magnetization hard axis of the second ferromagnetic layer 20. If the high frequency magnetic field generated from the third ferromagnetic layer 30 is applied in the direction of the magnetization hard axis of the second ferromagnetic layer 20, it becomes very easy for the magnetization of the second ferromagnetic layer to reverse.

In the magnetic memory element 110, the direction of the magnetization of the second ferromagnetic layer 20 can be controlled by passing an electronic current through the stacked body SB0. Specifically, the direction of the magnetization of the second ferromagnetic layer 20 can be reversed by changing the direction of the flow of the electronic current (polarity). When storing information, for example, "0" and "1" are allotted in accordance with the direction of the magnetization of the second ferromagnetic layer 20.

As a specific example of the operation in the magnetic memory element 110, first the "write" operation will now be described.

FIG. 3A to FIG. 3D are schematic views illustrating an operation of the magnetic memory element according to the embodiment.

The drawings illustrate states of the first stacked unit SB1 in the "write" operation in the magnetic memory element 110. In the drawings, the second stacked unit SB2 and the third nonmagnetic layer 30n are omitted.

FIG. 3A illustrates a state where an electronic current 60 has started to be passed from the first ferromagnetic layer 10 toward the second ferromagnetic layer 20. FIG. 3B illustrates a state where passing the electronic current 60 from the first ferromagnetic layer 10 toward the second ferromagnetic layer 20 has been completed (a state where the magnetization is reversed). FIG. 3C illustrates a state where the electronic current 60 has started to be passed from the second ferromagnetic layer 20 toward the first ferromagnetic layer 10. FIG. 3D illustrates a state where passing the electronic current 60 from the second ferromagnetic layer 20 toward the first ferromagnetic layer 10 has been completed (a state where the magnetization is reversed). FIG. 3C and FIG. 3D correspond to the cases where the direction of the electronic current 60 is reversed in the cases illustrated in FIG. 3A and FIG. 3B, respectively.

In the write operation, the electronic current 60 is passed to cross the film surface of the first ferromagnetic layer 10 and the film surface of the second ferromagnetic layer 20 to perform the write operation on the second ferromagnetic layer 20. Herein, the case is described where the magnetoresistive effect via the first nonmagnetic layer 10n is a normal type.

In the magnetoresistive effect of the "normal type," the electric resistance when the magnetizations of magnetic layers on both sides of a nonmagnetic layer are parallel to each other is lower than the electric resistance when they are antiparallel. In the case of the normal type, the electric resistance between the first ferromagnetic layer 10 and the second ferromagnetic layer 20 via the first nonmagnetic layer 10n is lower when the magnetization of the first ferromagnetic layer 10 is parallel to the magnetization of the second ferromagnetic layer 20 than when antiparallel.

As shown in FIG. 3A, an electron having passed through the first ferromagnetic layer 10 having a magnetization 12a in a direction substantially perpendicular to the film surface obtains a spin in the same direction as the magnetization of the first ferromagnetic layer 10. When the electron flows into the second ferromagnetic layer 20, the angular momentum of the spin is transmitted to the second ferromagnetic layer 20 to act on the magnetization 32 of the second ferromagnetic layer 20. That is, what is called a spin-transfer torque works.

Thereby, as shown in FIG. 3B, the magnetization 32 of the second ferromagnetic layer 20 becomes in the same direction as the magnetization 12a of the first ferromagnetic layer 10. This direction is the upward direction in FIG. 3B, for example one direction parallel to the stacking direction SD1. "0", for example, is allotted to the state of the second ferromagnetic layer 20 having the magnetization 32 in this direction (the upward direction in FIG. 3B).

As shown in FIG. 3C, out of the electrons having passed through the first nonmagnetic layer 10n, an electron having a spin in the same direction as the magnetization 12a of the first ferromagnetic layer 10 (the upward direction in FIG. 3C) passes through the first ferromagnetic layer 10. On the other hand, an electron having a spin in the opposite direction to the magnetization 12a of the first ferromagnetic layer 10 (the downward direction in FIG. 3C) is reflected at the interface between the first ferromagnetic layer 10 and the first nonmagnetic layer 10n. The angular momentum of the spin of the reflected electron is transmitted to the second ferromagnetic layer 20 to act on the magnetization 32 of the second ferromagnetic layer 20.

Thereby, as shown in FIG. 3D, the magnetization 32 of the second ferromagnetic layer 20 becomes in the opposite direction to the magnetization 12a of the first ferromagnetic layer 10 (the downward direction in FIG. 3D). That is, a spin-transfer torque works. "1", for example, is allotted to the state of the second ferromagnetic layer 20 having the magnetization 32 in this direction (the downward direction in FIG. 3D).

"0" or "1" is appropriately allotted to the different states of the second ferromagnetic layer 20 based on such action. Thereby, "writing" in the magnetic memory element 110 is performed.

On the other hand, in the case where the magnetoresistive effect is a "reverse type," the electric resistance between the first ferromagnetic layer 10 and the second ferromagnetic layer 20 via the first nonmagnetic layer 10n is higher when the magnetization of the first ferromagnetic layer 10 is parallel to the magnetization of the second ferromagnetic layer 20 than when antiparallel. The "write" operation in the reverse type is similar to that in the case of the normal type.

Next, the "read" operation will now be described.

The detection of the direction of the magnetization of the second ferromagnetic layer 20 in the magnetic memory element 110 is performed by, for example, utilizing the magnetoresistive effect. In the magnetoresistive effect, electric resistance changes with the relative direction of the magnetization of each layer. In the case where the magnetoresistive effect is utilized, a sense current is passed between the first ferromagnetic layer 10 and the second ferromagnetic layer 20 to measure the magnetic resistance. The current value of the sense current is smaller than the current value corresponding to the electronic current 60 passed at the time of storing.

FIG. 4A and FIG. 4B are schematic views illustrating an operation of the magnetic memory element according to the embodiment.

The drawings illustrate states of the first stacked unit SB1 in the "read" operation in the magnetic memory element 110. In the drawings, the second stacked unit SB2 and the third nonmagnetic layer 30n are omitted.

FIG. 4A illustrates the case where the direction of the magnetization of the first ferromagnetic layer 10 is the same as the direction of the magnetization of the second ferromagnetic layer 20. FIG. 4B illustrates the case where the direction of the magnetization of the first ferromagnetic layer 10 is antiparallel (opposite) to the direction of the magnetization of the second ferromagnetic layer 20.

As shown in FIG. 4A and FIG. 4B, a sense current 61 is passed through the first stacked unit SB1 to detect the electric resistance.

In the magnetoresistive effect of the normal type, the resistance in the state of FIG. 4A is lower than the resistance in the state of FIG. 4B. In the magnetoresistive effect of the reverse type, the resistance in the state of FIG. 4A is higher than the resistance in the state of FIG. 4B.

By relating "0" and "1" to these states of different resistances, respectively, the memory of two value data can be read out. The direction of the sense current 61 may be opposite to the direction illustrated in FIG. 4A and FIG. 4B.

Various examples of the stack configuration of the stacked body SB0 of the magnetic memory element according to the embodiment will now be described.

FIG. 5A and FIG. 5B are schematic cross-sectional views illustrating the configurations of other magnetic memory elements according to the first embodiment.

As shown in FIG. 5A and FIG. 5B, in magnetic memory elements 111a and 111b according to the embodiment, the first ferromagnetic layer 10 is disposed between the second ferromagnetic layer 20 and the fourth ferromagnetic layer 40, and the fourth ferromagnetic layer 40 is disposed between the first ferromagnetic layer 10 and the third ferromagnetic layer 30. The third nonmagnetic layer 30n is disposed between the first ferromagnetic layer 10 and the fourth ferromagnetic layer 40. The configuration in which the first to fourth ferromagnetic layers 10 to 40 are arranged in this order is referred to as a first stacked configuration for the sake of convenience.

In the magnetic memory element 111a, the magnetization of the first ferromagnetic layer 10 is in the upward direction and the magnetization of the fourth ferromagnetic layer 40 is in the upward direction. In the magnetic memory element 111b, the magnetization of the first ferromagnetic layer 10 is in the downward direction and the magnetization of the fourth ferromagnetic layer 40 is in the downward direction.

FIG. 6A and FIG. 6B are schematic cross-sectional views illustrating the configurations of other magnetic memory elements according to the first embodiment.

As shown in FIG. 6A and FIG. 6B, also in magnetic memory elements 112a and 112b according to the embodiment, the stacked body SB0 has the first stacked configuration. The magnetic memory element 112b has the same configuration as the magnetic memory element 110 illustrated in FIG. 1.

In the magnetic memory element 112a, the magnetization of the first ferromagnetic layer 10 is in the upward direction and the magnetization of the fourth ferromagnetic layer 40 is in the downward direction. In the magnetic memory element 112b, the magnetization of the first ferromagnetic layer 10 is in the downward direction and the magnetization of the fourth ferromagnetic layer 40 is in the upward direction.

That is, in the magnetic memory elements 112a and 112b, the direction of the component in Z-axis of the magnetization fixed in the first direction (the magnetization of the first ferromagnetic layer 10) is opposite to the direction of the component in Z-axis of the magnetization fixed in the second direction (the magnetization of the fourth ferromagnetic layer 40). The direction of the rotating magnetic field generated from the third ferromagnetic layer 30 agrees with the direction in which the magnetization of the second ferromagnetic layer 20 precesses.

In this configuration, the rotating magnetic field generated from the third ferromagnetic layer 30 acts more effectively on the second ferromagnetic layer 20. This can assist the magnetization reversal of the second ferromagnetic layer 20 more efficiently. Thereby, the current necessary for writing to the second ferromagnetic layer 20 can be more reduced.

FIG. 7A and FIG. 7B are schematic cross-sectional views illustrating the configurations of other magnetic memory elements according to the first embodiment.

As shown in FIG. 7A and FIG. 7B, in magnetic memory elements 112c and 112d according to the embodiment, the stacked body SB0 has the first stacked configuration. In these, the direction of the magnetization of the first ferromagnetic layer 10 and the direction of the magnetization of the fourth ferromagnetic layer 40 are oblique to the film surface. Also in this case, the direction of the component in Z-axis of the magnetization fixed in the first direction (the magnetization of the first ferromagnetic layer 10) is opposite to the direction of the component in Z-axis of the magnetization fixed in the second direction (the magnetization of the fourth ferromagnetic layer 40).

FIG. 8A and FIG. 8B are schematic cross-sectional views illustrating the configurations of other magnetic memory elements according to the first embodiment.

As shown in FIG. 8A and FIG. 8B, in magnetic memory elements 121a and 121b according to the embodiment, the second ferromagnetic layer 20 is disposed between the first ferromagnetic layer 10 and the third ferromagnetic layer 30, and the third ferromagnetic layer 30 is disposed between the second ferromagnetic layer 20 and the fourth ferromagnetic layer 40. The third nonmagnetic layer 30n is disposed between the second ferromagnetic layer 20 and the third ferromagnetic layer 30. The configuration in which the first to fourth ferromagnetic layers 10 to 40 are arranged in this order is referred to as a second stacked configuration for the sake of convenience.

Figure 9A:
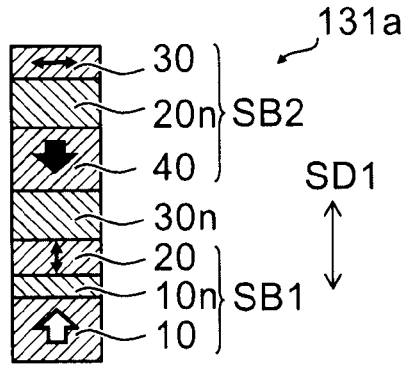
FIG. 9A and FIG. 9B are schematic cross-sectional views illustrating the configurations of other magnetic memory elements according to the first embodiment.
Figure 9B:
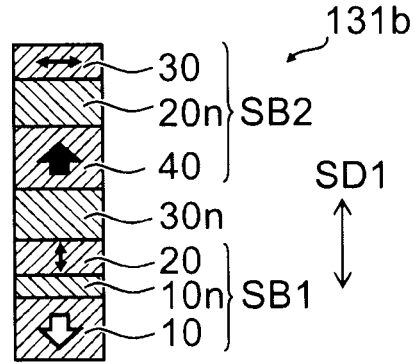

FIG. 9A and FIG. 9B are schematic cross-sectional views illustrating the configurations of other magnetic memory elements according to the first embodiment.

As shown in FIG. 9A and FIG. 9B, in magnetic memory elements 131a and 131b according to the embodiment, the second ferromagnetic layer 20 is disposed between the first ferromagnetic layer 10 and the fourth ferromagnetic layer 40, and the fourth ferromagnetic layer 40 is disposed between the second ferromagnetic layer 20 and the third ferromagnetic layer 30. The third nonmagnetic layer 30n is disposed between the second ferromagnetic layer 20 and the fourth ferromagnetic layer 40. The configuration in which the first to fourth ferromagnetic layers 10 to 40 are arranged in this order is referred to as a third stacked configuration for the sake of convenience.

Figure 10A:
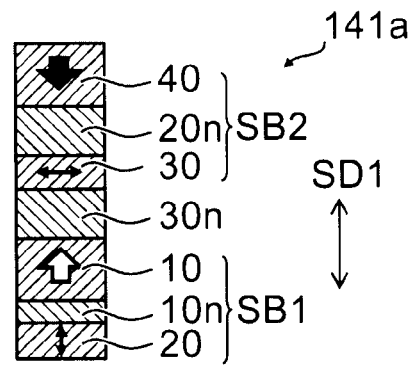
FIG. 10A and FIG. 10B are schematic cross-sectional views illustrating the configurations of other magnetic memory elements according to the first embodiment.
Figure 10B:
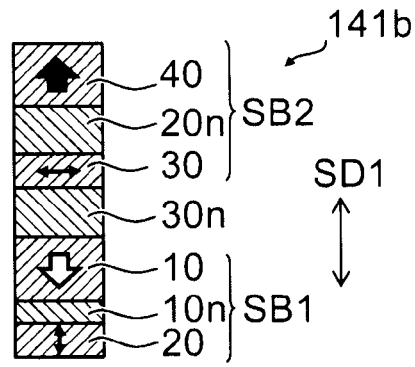

FIG. 10A and FIG. 10B are schematic cross-sectional views illustrating the configurations of other magnetic memory elements according to the first embodiment.

As shown in FIG. 10A and FIG. 10B, in magnetic memory elements 141a and 141b according to the embodiment, the first ferromagnetic layer 10 is disposed between the second ferromagnetic layer 20 and the third ferromagnetic layer 30, and the third ferromagnetic layer 30 is disposed between the first ferromagnetic layer 10 and the fourth ferromagnetic layer 40. The third nonmagnetic layer 30n is disposed between the first ferromagnetic layer 10 and the third ferromagnetic layer 30. The configuration in which the first to fourth ferromagnetic layers 10 to 40 are arranged in this order is referred to as a fourth stacked configuration for the sake of convenience.

In the magnetic memory elements 121a and 121b having the second stacked configuration, the magnetic memory elements 131a and 131b having the third stacked configuration, and the magnetic memory elements 141a and 141b having the fourth stacked configuration, the direction of the component in Z-axis of the magnetization fixed in the first direction (the magnetization of the first ferromagnetic layer 10) is opposite to the direction of the projected component in Z-axis of the magnetization fixed in the second direction (the magnetization of the fourth ferromagnetic layer 40). In the second to fourth stacked configurations, the direction of the component in Z-axis of the magnetization of the first ferromagnetic layer 10 may be the same as the direction of the component in Z-axis of the magnetization of the fourth ferromagnetic layer 40.

Furthermore, in the second to fourth stacked configurations, the directions of the magnetization of the first ferromagnetic layer 10 and the magnetization of the fourth ferromagnetic layer 40 may be oblique to the film surface.

Figure 11:
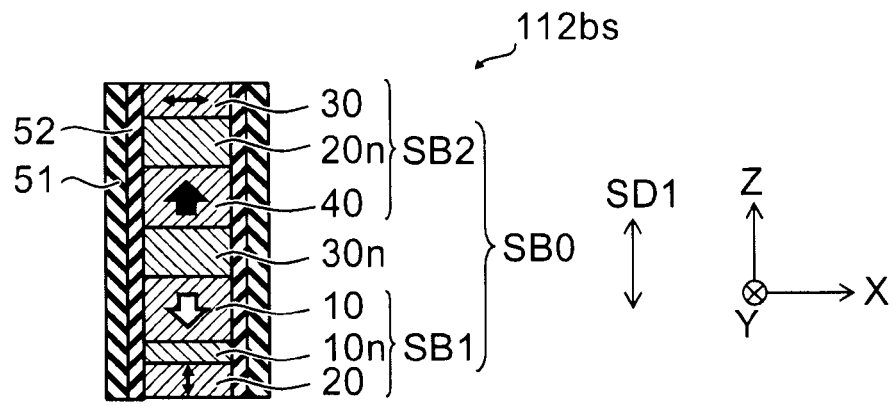
FIG. 11 is a schematic cross-sectional view illustrating the configurations of another magnetic memory element according to the first embodiment.

FIG. 11 is a schematic cross-sectional view illustrating the configuration of another magnetic memory element according to the first embodiment.

As shown in FIG. 11, in a magnetic memory element 112bs according to the embodiment, a magnetic shield 51 opposed to the side surface of the first stacked unit SB1 is provided. In this example, the magnetic shield 51 is further opposed to the side surface of the second stacked unit SB2 and the side surface of the third nonmagnetic layer 30n.

That is, the magnetic memory element 112bs further includes the magnetic shield 51 opposed to at least part of the side surface of the stacked body SB0. The magnetic shield 51 covers the above-mentioned at least part of the side surface of the stacked body SB0.

In addition, the magnetic memory element 112bs further includes a protection layer 52 provided between the above-mentioned at least part of the side surface of the stacked body SB0 and the magnetic shield 51.

In the magnetic memory element 112bs, the magnetic shield 51 covers the side surface of the first stacked unit SB1. In the magnetic memory element 112bs, the magnetic shield 51 covers the side surface of the first stacked unit SB1, the side surface of the second stacked unit SB2, and the side surface of the third nonmagnetic layer 30n.

For example, the side surface of the first stacked unit SB1 and the side surface of the second stacked unit SB2 are covered with the magnetic shield 51 such as a permalloy (Py) via the protection layer 52 such as, for example, SiN or $Al_2O_3$.

By providing the magnetic shield 51, it can be suppressed that astray magnetic field leaking from an adjacent magnetic memory element affects the operation of the first stacked unit SB1 and the second stacked unit SB2, when a plurality of magnetic memory elements are disposed. Thereby, the current injection amount necessary to generate the rotating magnetic field can be reduced. Furthermore, it can be suppressed that a stray magnetic field leaking from the first stacked unit SB1 and the second stacked unit SB2 exert an influence upon an adjacent magnetic memory element. As a consequence, the plurality of magnetic memory elements can be closely arranged to improve the integration degree.

Although with regard to the magnetic memory element 112bs, an example is given in which the magnetic shield 51 and the protection layer 52 are provided in the magnetic memory element 112b, the embodiment is not limited thereto. That is, in any stacked body SB0 having any of the first to fourth stacked configurations, the magnetic shield 51 may be provided and the protection layer 52 may be further provided.

Examples of the material used for the first to fourth ferromagnetic layers 10 to 40, the first to third nonmagnetic layers 10n to 30n, the magnetic shield 51, and the protection layer 52 are described later.

The characteristics of the third ferromagnetic layer 30 in the magnetic memory element according to the embodiment will now be described using the magnetic memory element 110 as an example. The following description can be applied to a magnetic memory element including any stacked body SB0 having any of the first to fourth stacked configurations.

In a structure in which the second stacked unit SB2 is stacked with the first stacked unit SB1 like the magnetic memory element 110 according to the embodiment, a stray magnetic field generated from the first ferromagnetic layer 10, the second ferromagnetic layer 20, and the fourth ferromagnetic layer 40 exists in the position of the third ferromagnetic layer 30. For example, the position of the third ferromagnetic layer 30 is a position of the center of the third ferromagnetic layer 30 along the X-Y-Z axes with respect to the position of the center of the second ferromagnetic layer 20 along the X-Y-Z axes. In such a state, the conditions whereby the third ferromagnetic layer 30 oscillates depend on the magnitude of the stray magnetic field.

The inventors of this application have newly found that, when the configuration of the stacked body SB0 satisfies certain conditions, oscillation takes place in the third ferromagnetic layer 30 in a prescribed range of the magnitude of the current flowing through the stacked body SB0 (particularly the third ferromagnetic layer 30).

Here, the stray magnetic field from the first ferromagnetic layer 10, the second ferromagnetic layer 20, and the fourth ferromagnetic layer 40 in the position of the third ferromagnetic layer 30 is denoted by Hs (Oe; oersted). The magnetic anisotropy of the third ferromagnetic layer 30 is denoted by Ku (erg/$cm^3$; erg/cubic centimeter). The damping coefficient of the third ferromagnetic layer 30 is denoted by $\alpha$. The magnetization of the third ferromagnetic layer 30 is denoted by Ms (emu/cc=emu/$cm^3$). The demagnetic field coefficient of the third ferromagnetic layer 30 is denoted by Nz. The damping coefficient $\alpha$ and the demagnetic field coefficient Nz are dimensionless constants.

When these values satisfy the relationship of Formula 2 below, the third ferromagnetic layer 30 oscillates in a certain current range.

$$K_u < \alpha M_s (8\pi N_z M_s - H_s) \quad (2)$$

That is, when Formula 2 is satisfied, a current range in which oscillation takes place in the third ferromagnetic layer 30 is present and stable operation is possible.

Here, the magnetic anisotropy Ku is the magnitude of the anisotropy in the film surface of the third ferromagnetic layer 30. That is, the magnetic anisotropy Ku may include not only the crystal magnetic anisotropy generated inherently depending on the material but also the shape magnetic anisotropy. Furthermore, the magnetic anisotropy Ku may include the anisotropy resulting from magnetic strain.

A permalloy, FeCo, Co, FeCoB, and the like are given as materials with low crystal magnetic anisotropy. These materials are preferably used as the third ferromagnetic layer 30. However, the embodiment is not limited thereto but materials other than the above may be used as the third ferromagnetic layer 30. It is also possible to reduce the magnetic anisotropy Ku by using an amorphous material as the third ferromagnetic layer 30.

The shape magnetic anisotropy can be found by measuring the dimensions and compositions of the layers and analyzing with a simulator using the values obtained by the measurement. The dimensions (width, thickness, etc.) of the layers can be measured through an electron microscope photograph or the like, for example. The compositions of the layers are found by, for example, SIMS (secondary ion-microprobe mass spectrometry), EELS (electron energy-loss spectroscopy), etc.

The parameters mentioned above are measured with, for example, a VSM (vibrating sample magnetometer), a Kerr effect measurement apparatus, etc.

In the calculation with the simulator, the mesh size is set less than the exchange coupling length found analytically from the dimensions and compositions identified in the above. In regard to the exchange coupling length, the smallest value out of the values calculated by $(A/Ku)^{1/2}$, $(A/2\pi Ms^2)^{1/2}$, and $(2A/(Heff \cdot Ms))^{1/2}$ is used. Herein, "A" is the exchange stiffness constant (µerg/cm; microerg/centimeter). Using a value not less than 0.5 µerg/cm and not more than 3 µerg/em as "A" does not cause a large difference in the magnitude of the exchange coupling length.

The characteristics of the magnetic memory element according to the embodiment will now be described.

The inventors of this application have simulated the oscillation characteristics in the third ferromagnetic layer 30. In this simulation, the following conditions were employed in the magnetic memory element 110 illustrated in FIG. 1. However, in order to evaluate the oscillation characteristics of the second stacked unit SB2, this simulation was performed on a model in which the first stacked unit SB1 was not provided and the second stacked unit SB2 was provided.

The shape of the magnetic field generation unit (the second stacked unit SB2) when cut along a plane perpendicular to the Z-axis was made a circle and the diameter thereof was set to 50 nanometers (nm).

The thickness of the third ferromagnetic layer 30 was set to 3 nm. An in-plane magnetization film having a magnetization Ms of 800 emu/cc was used as the third ferromagnetic layer 30.

The thickness of the fourth ferromagnetic layer 40 was set to 8 nm. A perpendicular magnetization film having a magnetization of 1000 emu/cc was used as the fourth ferromagnetic layer 40.

A Cu layer (thickness: 8 nm) was used as the second nonmagnetic layer 20n.

The damping coefficient α of the third ferromagnetic layer 30 was set to 0.01. The spin polarization degree of the third ferromagnetic layer 30 was set to 0.4

The magnetic anisotropy Ku of the third ferromagnetic layer 30 was changed between 0 erg/cm$^3$ and 50,000 erg/cm$^3$ to simulate the oscillation characteristics in the third ferromagnetic layer 30.

Figure 12:
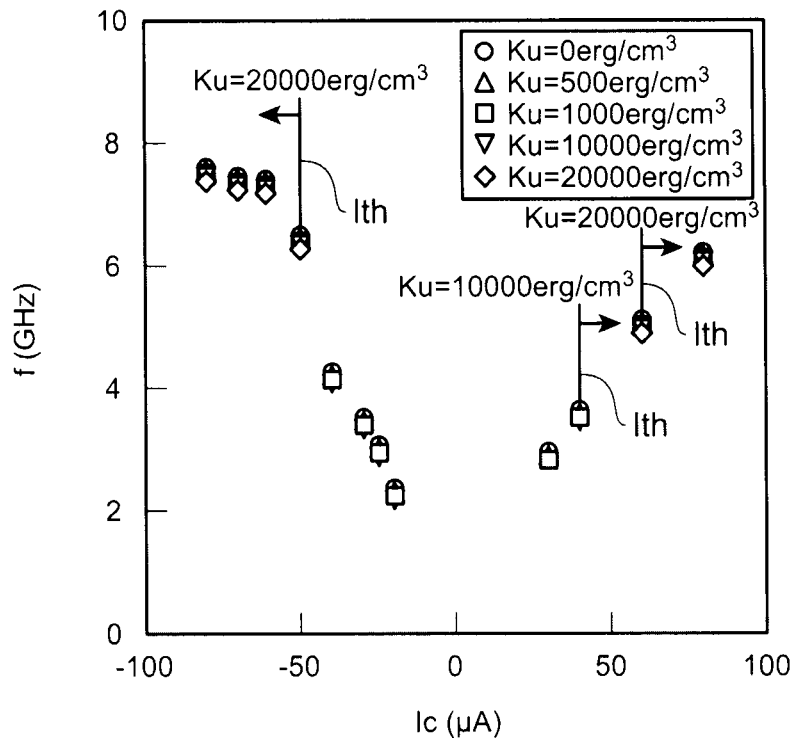
FIG. 12 is a graph illustrating characteristics of the magnetic memory element according to the first embodiment.

FIG. 12 is a graph illustrating characteristics of the magnetic memory element according to the first embodiment.

The drawing shows the current dependence of the frequency of the oscillation in the third ferromagnetic layer 30. The horizontal axis is the current Ic (μA; microampere), and the vertical axis is the frequency f (GHz; gigahertz).

As can be seen from FIG. 12, when the magnetic anisotropy Ku of the third ferromagnetic layer 30 is small, oscillation takes place even if the absolute value of the current Ic is small. As the magnetic anisotropy Ku of the third ferromagnetic layer 30 increases, the range of the current Ic in which oscillation takes place is narrowed. Oscillation did not take place when the magnetic anisotropy Ku of the third ferromagnetic layer 30 was 50,000 erg/cm$^3$. Therefore, FIG. 12 does not show the frequency f when the magnetic anisotropy Ku is 50,000 erg/cm$^3$.

According to LLG equations (Landau-Lifshitz-Gilbert-Langevin equations), the behavior of the magnetization of the third ferromagnetic layer 30 is expressed by Formula 3 below.

$$\frac{1+\alpha^2}{\gamma} \cdot \frac{d\vec{M}}{dt} = -\vec{M} \times (\vec{H}_{\text{eff}} + \alpha a_j \vec{p}) + \frac{\alpha}{M_s} \vec{M} \times \left\{ \vec{M} \times \left( -\vec{H}_{\text{eff}} + \frac{a_j}{\alpha} \vec{p} \right) \right\} \quad (3)$$

$\vec{M}$ is the magnetization vector of the third ferromagnetic layer, $\vec{H}_{\text{eff}}$ is the effective magnetic field applied to the third ferromagnetic layer, and $\vec{p}$ is the unit magnetization vector of the fourth ferromagnetic layer, where γ is the gyromagnetic ratio and α is the damping coefficient. $a_j$ represents the magnitude of the spin torque in the third ferromagnetic layer 30. Ms represents the magnetization of the third ferromagnetic layer 30. The first term of the right-hand side of Formula 3 expresses the precession term and the second term expresses the damping term.

The third ferromagnetic layer 30 oscillates stably when the second term of the right-hand side of Formula 3 is zero. Furthermore, the inventors of this application have found that oscillation takes place when the magnitude of the spin torque of the second term is smaller than the maximum value of the demagnetic field.

Based on this, Formula 4 below is analytically derived. That is, a current range in which oscillation takes place is present when the stray magnetic field Hs from the first ferromagnetic layer 10, the second ferromagnetic layer 20, and the fourth ferromagnetic layer 40 in the position of the third ferromagnetic layer 30, the magnetic anisotropy Ku of the third ferromagnetic layer 30, the damping coefficient α of the third ferromagnetic layer 30, the magnetization Ms of the third ferromagnetic layer 30, and the demagnetic field coefficient Nz of the third ferromagnetic layer 30 satisfy the relationship of Formula 4 below.

$$K_u \leq \alpha M_s (8\pi N_z M_s - H_s) \quad (4)$$

The stray magnetic field Hs mentioned above can be analytically found by the method described in R. Engel-Herbert and T. Hesjedal: *J. Appl. Phys.*, 97, 074504 (2005) on the basis of the configurations of the layers.

The dimensions (width, thickness, etc.) of the layers are found through an electron microscope photograph or the like, for example. The compositions of the layers can be identified by SIMS, EELS, etc. The parameters are measured with a VSM and a Kerr effect measurement apparatus.

Furthermore, the inventors of this application have simulated the angle of the magnetization of the third ferromagnetic layer 30 when the third ferromagnetic layer 30 oscillates. In this simulation, the model of the simulation described in regard to FIG. 12 was employed. The magnetic anisotropy Ku of the third ferromagnetic layer 30 was set to 5000 erg/cm$^3$. The value of the current Ic was changed to find the oscillation characteristics.

Figure 13:
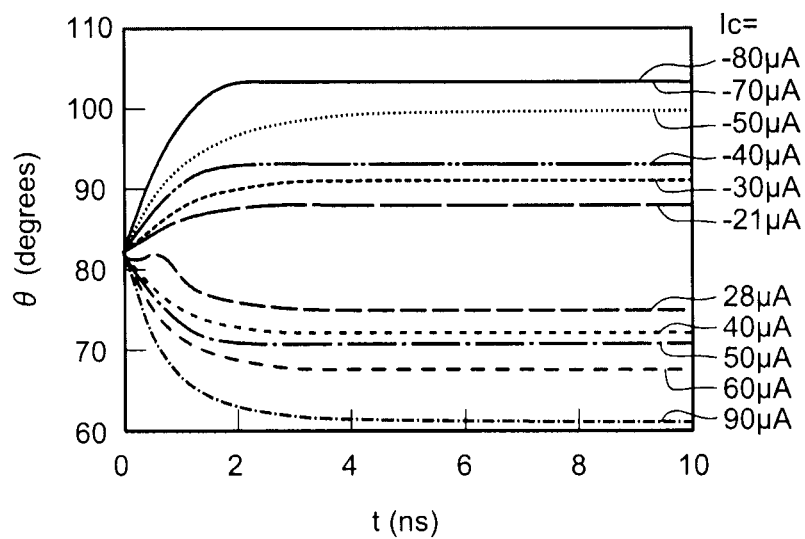
FIG. 13 is a graph illustrating characteristics of the magnetic memory element.

FIG. 13 is a graph illustrating characteristics of the magnetic memory element.

The drawing shows the change in the direction of the magnetization of the third ferromagnetic layer 30 from when the current Ic started to be passed through the third ferromagnetic layer 30. The horizontal axis is time t (ns; nanosecond). The vertical axis is the angle θ (degree). The angle θ is the angle between the direction of the magnetization of the third ferromagnetic layer 30 and the stacking direction SD1 (the Z-axis). As a system of units, the conversion from "°; degree" to "rad; radian" is "rad=(2π/360)×degree".

In this simulation, as illustrated in FIG. 1, the direction from the third ferromagnetic layer 30 toward the fourth ferromagnetic layer 40 is referred to as the "downward direction" and the direction from the fourth ferromagnetic layer 40 toward the third ferromagnetic layer 30 is referred to as the "upward direction."

In this simulation, it was assumed that, before current passage, the magnetization of the third ferromagnetic layer 30 was inclined in the "downward direction" due to the stray magnetic field in the "downward direction" (the angle θ being approximately 82 degrees). The absolute value of the angle θ being 90 degrees corresponds to the presence of a magnetization vector in the X-Y plane. In the case where a current is passed in the negative direction (the "downward direction"), the magnetization is inclined upward from the X-Y plane. In the case where a current is passed in the positive direction (the "upward direction"), the magnetization is inclined downward from the X-Y plane.

As shown in FIG. 13, when the time t becomes 4 ns or more, the angle θ becomes substantially a constant value and is stabilized. The angle θ after stabilization is the angle θ of the direction of the magnetization of the third ferromagnetic layer 30 when the third ferromagnetic layer 30 keeps the oscillation state. When the absolute value of the current Ic is large, the change in the angle θ due to current passage (the absolute value of the difference between the angle θ before current passage and the angle θ after stabilization) is large. The characteristics when the current Ic was −80 μA almost agreed with the characteristics when the current Ic was −70 μA.

From such a simulation result, the inventors of this application have found that, when oscillation takes place in the third ferromagnetic layer 30, the absolute value of the angle by which the magnetization is inclined from the film surface is not more than 40 degrees.

The inventors of this application have simulated the state of the magnetization vector when the magnetization of the third ferromagnetic layer 30 is inclined (when the third ferromagnetic layer 30 keeps the oscillation state). The ratio of the component parallel to the Z-axis of the magnetization vector of the third ferromagnetic layer 30 to the magnetization vector (the film-surface-perpendicular-direction proportion) was found. In this simulation, the stacked body SB0 was shaped like a circular cylinder in the magnetic memory element 110 having the configuration illustrated in FIG. 1, and the characteristics when the diameter φ of the stacked body SB0 cut along a plane perpendicular to the Z-axis direction was 20 nm and when it was 50 nm were simulated.

Figure 14:
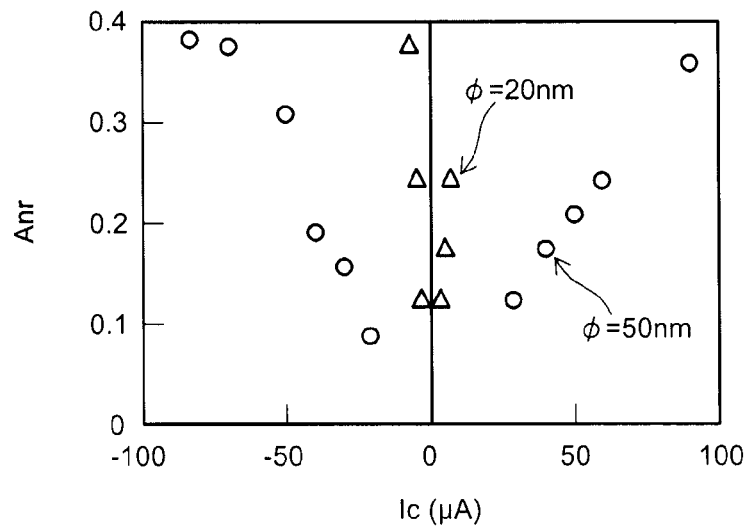
FIG. 14 is a graph illustrating characteristics of the magnetic memory element.

FIG. 14 is a graph illustrating characteristics of the magnetic memory element.

The horizontal axis is the current Ic, and the vertical axis is the film-surface-perpendicular-direction proportion Anr of the magnetization (the ratio of the component parallel to the Z-axis of the magnetization vector of the third ferromagnetic layer 30 to the magnetization vector when the third ferromagnetic layer 30 keeps the oscillation state).

As shown in FIG. 14, it has been found that the proportion Anr of a magnetization component projected in a direction perpendicular to the film surface to the magnetization (the ratio of the component parallel to the Z-axis of the magnetization vector of the third ferromagnetic layer 30 to the magnetization vector) is not more than 0.4.

Therefore, the current range in which oscillation takes place is expanded and the margin of operation is widened when the stray magnetic field Hs, the magnetic anisotropy Ku of the third ferromagnetic layer 30, the damping coefficient α of the third ferromagnetic layer 30, the magnetization Ms of the third ferromagnetic layer 30, and the demagnetic field coefficient Nz of the third ferromagnetic layer 30 satisfy Formula 5 below.

$$K_u < \alpha M_s (0.4 \times 8\pi N_z M_s - H_s) \quad (5)$$

In a structure in which the second stacked unit SB2 is stacked with the first stacked unit SB1 like the magnetic memory element according to the embodiment (e.g. the magnetic memory element 110 etc.), preferably the third ferromagnetic layer 30 does not oscillate (false writing does not take place) due to a read current $I_R$ passed in order to read out the memory state (magnetization state) of the second ferromagnetic layer 20. The read current $I_R$ is the current passed through the stacked body SB0 (i.e., the current passed through the third ferromagnetic layer 30) in the read operation.

When the stray magnetic field Hs, the magnetic anisotropy Ku of the third ferromagnetic layer 30, the damping coefficient α of the third ferromagnetic layer 30, the magnetization Ms of the third ferromagnetic layer 30, the demagnetic field coefficient Nz of the third ferromagnetic layer 30, the volume V (cm³; cubic centimeter) of the third ferromagnetic layer 30, and the read current $I_R$ (A; ampere) satisfy the relationship of Formula 6 below, a current range in which oscillation takes place can be ensured while avoiding false writing at the reading.

$$\frac{\hbar}{2e} \cdot \frac{g(\theta)}{V} \cdot I_R + \alpha(H_s - 4\pi N_z M_z) < K_u < \alpha M_s(0.4 \times 8\pi N_z M_s - H_s) \quad (6)$$

-continued $$\hbar = h/2\pi$$

where h represents the Planck constant (approximately $6.626 \times 10^{-27}$ erg·s; erg·second). $6.626 \times 10^{-27}$ erg·s (erg·second) is equivalent to $6.626 \times 10^{-34}$ J·s (joule·second). e represents the elementary electric charge (approximately $1.602 \times 10^{-19}$ A·s; ampere·second). g(θ) is a parameter representing the efficiency of spin transfer depending on the spin polarization degree. g(θ) is analytically found as a function of the polarization degree and the angle θ of the magnetization of the third ferromagnetic layer 30. The spin polarization degree is found from, for example, the MR ratio of the third ferromagnetic layer 30. The unit of the angle θ in Formula 6 is radian (rad). The angle θ may be analytically found if the dimensions and the magnitude of the effective magnetic field of the third ferromagnetic layer 30 are obtained. Alternatively, the angle θ may be found from the MR ratio of the third ferromagnetic layer 30.

In view of the inclination of the magnetization at the time of oscillation found by a micromagnetics analysis, Formula 7 below may be used instead of Formula 6.

$$\frac{\hbar}{2e} \cdot \frac{g(\theta)}{V} \cdot I_R - \alpha(H_s - 0.4 \times 4\pi N_z M_s) \leq K_u \leq \alpha M_s(0.4 \times 8\pi N_z M_s - H_s) \quad (7)$$

That is, when the stray magnetic field Hs, the magnetic anisotropy Ku of the third ferromagnetic layer 30, the damping coefficient α of the third ferromagnetic layer 30, the magnetization Ms of the third ferromagnetic layer 30, the demagnetic field coefficient Nz of the third ferromagnetic layer 30, and the read current $I_R$ satisfy the relationship of Formula 7 above, a current range in which oscillation takes place can be ensured while avoiding false writing at the time of reading.

Furthermore, an investigation was conducted on the value of the left-hand side of Formula 7 (i.e., the lower limit of the magnetic anisotropy Ku of the third ferromagnetic layer 30). More specifically, the characteristics in the case where the left-hand side of Formula 7 does not have the second term and has only the first term (the case where the influence of the demagnetic field is not taken into consideration) and in the case where the left-hand side of Formula 7 has the first term and the second term mentioned above (the case where the influence of the demagnetic field is taken into consideration) were found.

Figure 15:
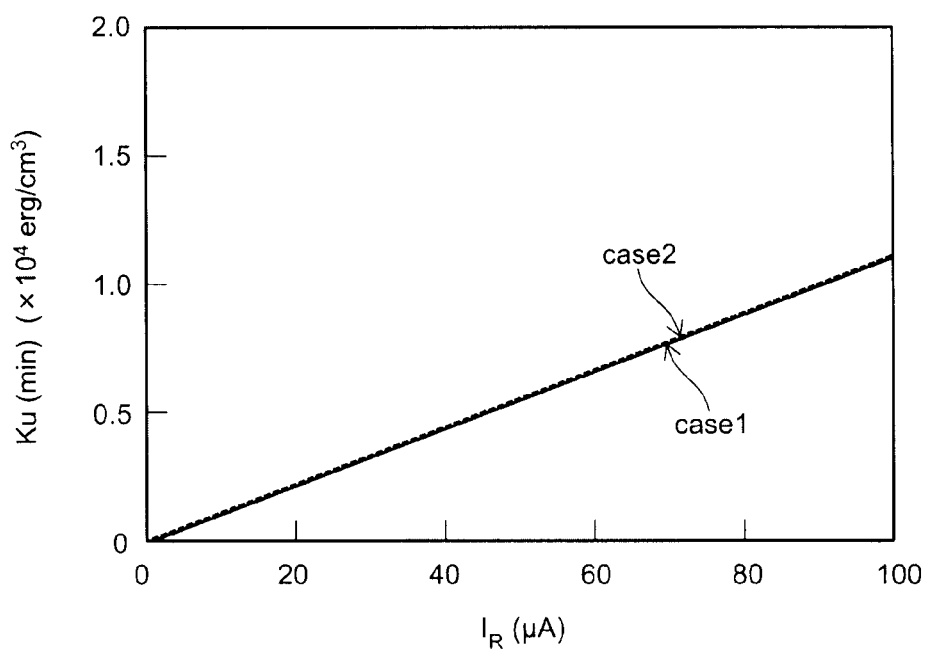
FIG. 15 is a graph illustrating characteristics of the magnetic memory element.

FIG. 15 is a graph illustrating characteristics of the magnetic memory element.

The horizontal axis is the read current $I_R$ (μA). The vertical axis is the left-hand side of Formula 7 (the lower limit Ku(min) of the magnetic anisotropy Ku). FIG. 15 shows the characteristics in the case where the left-hand side of Formula 7 does not have the second term and has only the first term (the case where the influence of the demagnetic field is not taken into consideration; case 1) and in the case where the left-hand side of Formula 7 has the first term and the second term (the case where the influence of the demagnetic field is taken into consideration; case 2).

As can be seen from FIG. 15, the characteristics in the case where the influence of the demagnetic field is not taken into consideration (case 1) substantially agree with the characteristics in the case where the influence of the demagnetic field is taken into consideration (case 2). From this, the second term of the left-hand side of Formula 7 can be omitted when considering the lower limit Ku(min) of the magnetic anisotropy Ku of the third ferromagnetic layer 30.

That is, when the stray magnetic field Hs, the magnetic anisotropy Ku of the third ferromagnetic layer 30, the damping coefficient α of the third ferromagnetic layer 30, the magnetization Ms of the third ferromagnetic layer 30, the demagnetic field coefficient Nz of the third ferromagnetic layer 30, and the read current $I_R$ satisfy the relationship of Formula 8 below, a current range in which oscillation takes place can be ensured while avoiding false writing at the time of reading.

$$\frac{\hbar}{2e} \cdot \frac{g(0)}{V} \cdot I_R < K_u < \alpha M_s (0.4 \times 8\pi N_z M_s - H_s) \qquad (8)$$

Hereinbelow, examples of the configurations of the first to fourth ferromagnetic layers 10 to 40, the first to third nonmagnetic layers 10n to 30n, the magnetic shield 51, and the protection layer 52 are described.

As the first ferromagnetic layer 10 and the second ferromagnetic layer 20, a metal material including at least one element selected from the group consisting of iron (Fe), cobalt (Co), nickel (Ni), manganese (Mn), and chromium (Cr), for example, is preferably used. In addition, an alloy by the combination of at least one selected from the group mentioned above and at least one element selected from the group consisting of platinum (Pt), palladium (Pd), iridium (Ir), ruthenium (Ru), and rhodium (Rh) may be used.

The characteristics of the first ferromagnetic layer 10 and the second ferromagnetic layer 20 can be adjusted by the composition of the magnetic material contained and heat treatment. Furthermore, as the first ferromagnetic layer 10 and the second ferromagnetic layer 20, an amorphous alloy of rare earth-transition metal such as TbFeCo and GdFeCo may be used. A stacked structure such as Co/Pt, Co/Pd, and Co/Ni may be used as the first ferromagnetic layer 10 and the second ferromagnetic layer 20. Co/Ru, Fe/Au, Ni/Cu, and the like become a perpendicular magnetization film depending on the combination with the underlayer. Co/Ru, Fe/Au, Ni/Cu, and the like can be used as the first ferromagnetic layer 10 and the second ferromagnetic layer 20 by controlling the crystalline orientation direction of the film. The first ferromagnetic layer 10 and the second ferromagnetic layer 20 may contain an additive such as aluminum (Al), germanium (Ge), nitrogen (N), phosphorus (P), arsenic (As), boron (B), and silicon (Si).

An insulating material functioning as a nonmagnetic tunnel barrier layer may be used as the first nonmagnetic layer 10n. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the first nonmagnetic layer 10n, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used. In addition, for example, a nonmagnetic semiconductor ($ZnO_x$, InMn, GaN, GaAs, $TiO_x$, Zn, and Te or these materials doped with a transition metal) and the like may be used as the first nonmagnetic layer 10n.

The thickness of the first nonmagnetic layer 10n is preferably set to a value in a range approximately from 0.2 nanometers to 2.0 nm. Thereby, for example, an excessive high resistance is suppressed while ensuring the uniformity of the insulating film.

As the second nonmagnetic layer 20n, for example, one of a nonmagnetic tunnel barrier layer and a nonmagnetic metal layer may be used.

An insulating material, for example, is used as the nonmagnetic tunnel barrier layer. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used as the nonmagnetic tunnel barrier layer. In addition, as the nonmagnetic tunnel barrier layer, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used.

As the nonmagnetic tunnel barrier layer, a nonmagnetic semiconductor ($ZnO_x$, InMn, GaN, GaAs, $TiO_x$, Zn, and Te or these materials doped with a transition metal) and the like may be used.

In the case where a nonmagnetic tunnel barrier layer is used as the second nonmagnetic layer 20n, the thickness of the second nonmagnetic layer 20n is preferably set to a value in a range approximately from 0.2 nm to 2.0 nm.

As the nonmagnetic metal layer used as the second nonmagnetic layer 20n, for example, a nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi) or an alloy including at least two elements selected from the group mentioned above may be used. The thickness of the second nonmagnetic layer 20n is preferably made not less than 1.5 nm and not more than 20 nm. Thereby, an interlayer coupling does not occur between magnetic layers, and the loss of the spin polarization state of a conduction electron is suppressed when the conduction electron passes through the nonmagnetic metal layer.

As the third ferromagnetic layer 30, for example, a magnetic metal including at least one element selected from the group consisting of iron (Fe), cobalt (Co), nickel (Ni), manganese (Mn), and chromium (Cr) may be used. Furthermore, an alloy by the combination of at least one selected from the group mentioned above and at least one element selected from the group consisting of platinum (Pt), palladium (Pd), iridium (Ir), ruthenium (Ru), and rhodium (Rh) may be used.

The characteristics of the third ferromagnetic layer 30 can be adjusted by the composition of the magnetic material contained and heat treatment. The third ferromagnetic layer 30 may contain an additive such as aluminum (Al), germanium (Ge), nitrogen (N), phosphorus (P), arsenic (As), boron (B), and silicon (Si). In addition, as the third ferromagnetic layer 30, a stacked structure such as Co/Pt, Co/Pd, and Co/Ni may be used. Co/Ru, Fe/Au, Ni/Cu, and the like can be used as the third ferromagnetic layer 30 by controlling the crystalline orientation direction of the film.

As the fourth ferromagnetic layer 40, a metal material including at least one element selected from the group consisting of iron (Fe), cobalt (Co), nickel (Ni), manganese (Mn), and chromium (Cr) is preferably used. Furthermore, an alloy by the combination of these and at least one element selected from the group consisting of platinum (Pt), palladium (Pd), iridium (Ir), ruthenium (Ru), and rhodium (Rh) may be used.

The characteristics of the fourth ferromagnetic layer 40 can be adjusted by the composition of the magnetic material contained and heat treatment. As the fourth ferromagnetic layer 40, an amorphous alloy of rare earth-transition metal such as TbFeCo and GdFeCo may be used. In addition, as the fourth ferromagnetic layer 40, a stacked structure such as Co/Pt, Co/Pd, and Co/Ni may be used. Co/Ru, Fe/Au, Ni/Cu, and the like become a perpendicular magnetization film depending on the combination with the underlayer. Co/Ru, Fe/Au, Ni/Cu, and the like can be used as the fourth ferromagnetic layer 40 by controlling the crystalline orientation direction of the film. The fourth ferromagnetic layer 40 may contain an additive such as aluminum (Al), germanium (Ge), nitrogen (N), phosphorus (P), arsenic (As), boron (B), and silicon (Si).

A nonmagnetic metal layer is used as the third nonmagnetic layer 30n.

As the nonmagnetic metal layer used as the third nonmagnetic layer 30n, at least one nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), and osmium (Os) or an alloy including two or more elements selected from the group mentioned above may be used.

As the third nonmagnetic layer 30n, a material with a long spin diffusion length such as copper (Cu) or a material with a short spin diffusion length such as ruthenium (Ru) may be used. In the case where it is desirable to cancel the effect of spin-polarized electrons being interposed, a material with a short spin diffusion length such as ruthenium (Ru) is preferably used as the third nonmagnetic layer 30n.

In the magnetic memory element according to the embodiment (e.g. the magnetic memory element 110 etc.), a pair of electrodes for passing an electronic current through the stacked body SB0 are provided.

A conductive magnetic material or a conductive nonmagnetic material is used as the electrode. Specific examples of the conductive magnetic material include a material similar to the material used as the third ferromagnetic layer 30 and the fourth ferromagnetic layer 40.

Specific examples of the conductive nonmagnetic material include a metal selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), tungsten (W), platinum (Pt), bismuth (Bi), and aluminum (Al) or an alloy including two or more selected from the group mentioned above.

In addition, as the conductive nonmagnetic material used as the electrode, a material such as carbon nanotube, carbon nanowire, and graphene is given.

As the conductive protection film provided for the electrode, an alloy including at least one element selected from the group consisting of tantalum (Ta), ruthenium (Ru), copper (Cu), gold (Au), silver (Ag), and aluminum (Al) or a material such as graphene may be used. An element selected from the group consisting of copper (Cu) and aluminum (Al) or an alloy including them is preferably used as the protection film from the viewpoint of being resistant to electromigration and low resistive.

As the protection layer 52, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the magnetic shield 51, an element selected from the group consisting of iron (Fe), cobalt (Co), nickel (Ni), manganese (Mn), and chromium (Cr) or an alloy including two or more selected from the group may be used.

In addition, as the magnetic shield 51, an alloy by the combination of at least one element selected from the group consisting of iron (Fe), cobalt (Co), nickel (Ni), manganese (Mn), and chromium (Cr) and at least one element selected from the group consisting of platinum (Pt), palladium (Pd), iridium (Ir), ruthenium (Ru), and rhodium (Rh) may be used.

The characteristics of the magnetic shield 51 can be adjusted by the composition of the magnetic material contained in the magnetic shield 51 and heat treatment. Furthermore, as the magnetic shield 51, an amorphous alloy of rare earth-transition metal such as TbFeCo and GdFeCo may be used. Furthermore, a stacked structure such as Co/Pt, Co/Pd, and Co/Ni may be used as the magnetic shield 51.

As described above, the shapes of the first stacked unit SB1 and the second stacked unit SB2 when cut along a plane perpendicular to the Z-axis are arbitrary. For example, the shapes of the first stacked unit SB1 and the second stacked unit SB2 when cut along a plane perpendicular to the Z-axis (the cross-sectional shape taken along a plane parallel to the film surface) may be a circle, ellipse, flat circle, and polygon having three or more angles such as a tetragon and hexagon.

The shapes of the first stacked unit SB1 and the second stacked unit SB2 when cut along a plane parallel to the Z-axis are arbitrary. The shapes of the first stacked unit SB1 and the second stacked unit SB2 when cut along a plane parallel to the Z-axis (the cross-sectional shape taken along a plane perpendicular to the film surface) may have, for example, a tapered shape or an inverse tapered shape.

In the magnetic memory elements 112a and 112b illustrated in FIG. 6A and FIG. 6B, the magnetic memory elements 112c and 112d illustrated in FIG. 7A and FIG. 7B, the magnetic memory elements 121a and 121b illustrated in FIG. 8A and FIG. 8B, the magnetic memory elements 131a and 131b illustrated in FIG. 9A and FIG. 9B, and the magnetic memory elements 141a and 141b illustrated in FIG. 10A and FIG. 10B, the direction of the component in Z-axis of the magnetization of the first ferromagnetic layer 10 is opposite to the direction of the component in Z-axis of the magnetization of the fourth ferromagnetic layer 40.

In this case, the stray magnetic field applied in the direction perpendicular to the film surface in the position of the second ferromagnetic layer 20 can be reduced (for example, canceled). On the other hand, the stray magnetic field applied in the direction perpendicular to the film surface in the position of the third ferromagnetic layer 30 can be caused to remain and act.

Thereby, the direction of the rotating magnetic field generated from the third ferromagnetic layer 30 agrees with the direction in which the magnetization of the second ferromagnetic layer 20 precesses. The rotating magnetic field generated from the third ferromagnetic layer 30 can assist the magnetization reversal of the second ferromagnetic layer 20 efficiently. As a result, the current necessary for storing (writing) information into the second ferromagnetic layer 20 can be reduced.

In the magnetic memory element having the first stacked configuration (e.g. the magnetic memory elements 112a, 112b, 112c, and 112d etc.), the first ferromagnetic layer 10 and the fourth ferromagnetic layer 40 may be coupled antiferromagnetically via the third nonmagnetic layer 30n. Such a structure in which mutual magnetization directions are coupled antiferromagnetically via a nonmagnetic layer to become antiparallel is called a synthetic anti-ferromagnet (SAF) structure. In this example, the stacked structure of "a first magnetic layer (e.g. the first ferromagnetic layer 10)/a nonmagnetic layer (e.g. the third nonmagnetic layer 30n)/a second magnet layer (e.g. the fourth ferromagnetic layer 40)" corresponds to the SAF structure.

Using the SAF structure can enhance the mutual magnetization fixing strength and increase resistance to external magnetic fields and thermal stability. In the structure, the stray magnetic field applied in the direction perpendicular to the film surface in the position of the magnetic memory layer (e.g. the second ferromagnetic layer 20) can be made almost zero.

A metal material such as ruthenium (Ru), iridium (Ir), and osmium (Os) is used as the nonmagnetic layer (intermediate layer) of the SAF structure. The thickness of the nonmagnetic layer is set not more than 3 nm. Thereby, a sufficiently strong antiferromagnetic coupling is obtained via the nonmagnetic layer.

That is, the third nonmagnetic layer 30n preferably contains a metal selected from the group consisting of ruthenium (Ru), osmium (Os), and iridium (Ir) or an alloy including at least two selected from the group, and the thickness of the third nonmagnetic layer 30n is preferably not more than 3 nm.

The dimensions (width, thickness, etc.) of the layers included in the magnetic memory element according to the embodiment are found through an electron microscope photographic image or the like, for example.

In the magnetic memory element having the second stacked configuration (e.g. the magnetic memory elements 121a and 121b etc.), the distance between the second ferromagnetic layer 20 and the third ferromagnetic layer 30 is shorter than, for example, that in the magnetic memory elements 121a to 121b. Thereby, the rotating magnetic field generated from the third ferromagnetic layer 30 can act on the second ferromagnetic layer 20 more and assist the magnetization reversal of the second ferromagnetic layer 20 more efficiently. Thereby, the current necessary for writing to the second ferromagnetic layer can be more reduced.

In the magnetic memory elements 121a and 121b, if the spin information is kept in the third nonmagnetic layer 30n, the third ferromagnetic layer 30 is affected by the spin-transfer torque from the second ferromagnetic layer 20. This may cause a decrease in the controllability of the magnetization rotation of the third ferromagnetic layer 30.

At this time, as the third nonmagnetic layer 30n, a film with a short spin diffusion length such as, for example, ruthenium (Ru) (a material having the function of spin cancel) or a layer having a structure with a short spin diffusion length is preferably used. This can suppress the decrease in the controllability of the magnetization rotation of the third ferromagnetic layer 30.

That is, the magnitude of the spin-transfer torque for the magnetization of the third ferromagnetic layer 30 to precess is determined by the spin polarization in the fourth ferromagnetic layer 40. In this configuration, the magnetization of the third ferromagnetic layer 30 can be independently controlled without being affected by the spin of other electrons (spin-transfer torque).

As the material of the third nonmagnetic layer 30n providing such a spin cancel effect, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more selected from the group can be given.

In the second stacked configuration, the thickness of the third nonmagnetic layer 30n is preferably set to a value that does not cause an interlayer magnetic coupling between the second ferromagnetic layer 20 and the third ferromagnetic layer 30. Specifically, the thickness of the third nonmagnetic layer 30n is preferably set not less than 1.4 nm.

If the thickness of the third nonmagnetic layer 30n is not less than 1.4 nm, the second ferromagnetic layer 20 and the third ferromagnetic layer 30 are not interlayer-coupled, and the spin polarization degree can be canceled in the third nonmagnetic layer 30n when conduction electrons pass through the interior and interface of the third nonmagnetic layer 30n. Furthermore, the third nonmagnetic layer 30n can prevent the precession of the third ferromagnetic layer 30 from changing due to the direction of the magnetization of the second ferromagnetic layer 20.

On the other hand, if the thickness of the third nonmagnetic layer 30n exceeds 20 nm, the pillar formation of a multiple-layer film is difficult. Furthermore, the strength of the rotating magnetic field generated from the third ferromagnetic layer 30 decreases in the position of the second ferromagnetic layer 20. Therefore, the thickness of the third nonmagnetic layer 30n is preferably set not more than 20 nm.

In the second stacked configuration, as the third nonmagnetic layer 30n, a stacked film may be used as well as the single-layer film described above. The stacked film may have, for example, a stacked configuration of the following layers: a layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more selected from the group; and a copper (Cu) layer stacked at least on one side of the layer.

In addition, the stacked film used as the third nonmagnetic layer 30n may have, for example, a stacked configuration including the following layers: a first layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more selected from the group; and a second layer stacked at least on one side of the first layer and containing an oxide including at least one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru).

In the magnetic memory element having the third stacked configuration (e.g. the magnetic memory elements 131a and 131b etc.) and the magnetic memory element having the fourth stacked configuration (e.g. the magnetic memory elements 141a and 141b etc.), the distance between the second ferromagnetic layer 20 and the third ferromagnetic layer 30 is shorter than that in the magnetic memory elements 112a and 112b. Thereby, the rotating magnetic field generated from the third ferromagnetic layer 30 can act on the second ferromagnetic layer 20 more and assist the magnetization reversal of the second ferromagnetic layer 20 more efficiently. Thereby, the current necessary for writing to the second ferromagnetic layer 20 can be more reduced.

In the magnetic memory element having the third stacked configuration and the magnetic memory element having the fourth stacked configuration, a metal conductor, insulator, or semiconductor may be used as the third nonmagnetic layer 30n and the second nonmagnetic layer 20n. Layers based on different materials may be used as the third nonmagnetic layer 30n and the second nonmagnetic layer 20n.

In the case where an insulator or a semiconductor is used as the third nonmagnetic layer 30n in the magnetic memory element having the third stacked configuration and the magnetic memory element having the fourth stacked configuration, the resistance value increases. Therefore, in this case, a metal conductor is preferably used as the second nonmagnetic layer 20n. As the metal conductor, copper (Cu), aluminum (Al), silver (Ag), gold (Au), and the like are preferably used.

A method for manufacturing a magnetic memory element according to the embodiment will now be described. The following manufacturing method is applied to the magnetic memory elements according to the embodiment (e.g. the magnetic memory element 110 etc.), magnetic memory elements modified based on them, etc. by changing the order of the fabrication of the layers as appropriate.

In the following description, "material A\material B" means that material B is stacked on material A.

A lower electrode (not shown) is formed on a wafer, and then the wafer is placed in an ultrahigh vacuum sputter apparatus. On the lower electrode, Ta\Ru (a contact layer for contact with an electrode, also functioning as a stopper layer), a CoFeB\FePt layer (the first ferromagnetic layer 10), MgO (the first nonmagnetic layer 10n), an FePd\CoFeB layer (the second ferromagnetic layer 20), and a Ta\Ru layer (a contact layer, also functioning as a stopper layer and the third nonmagnetic layer 30n) thereon are stacked in this order. Here, the strength of the magnetic anisotropy in the film surface perpendicular direction of the FePd\CoFeB layer and the CoFeB\FePt layer can be adjusted by annealing in a magnetic field. Subsequently, an FePt\CoFeB\Cu\Py layer (the magnetic field generation unit) and a Ta\Ru layer (a contact layer, also functioning as a stopper layer) are stacked in this order. Thereby, a workpiece is formed.

Next, an EB (electron beam) resist is applied to perform EB exposure to form a resist mask with a diameter of 50 nm. Ion milling is performed to remove the portions not covered with the resist of the workpiece until the Ta layer of a stopper layer becomes exposed.

After that, a $SiO_2$ film that forms an embedded insulating layer is deposited, and then the resist is lifted off.

Next, a $SiO_2$ film that forms an embedded insulating layer is deposited, then planarization is performed by CMP (chemical mechanical polishing) or the like, and then RIE (reactive ion etching) or the like is performed to etch the entire surface to expose the contact layer for contact with an electrode.

Further, a resist is applied to the entire surface, and a stepper exposure apparatus is used to perform patterning on the resist so that the opening of the resist may correspond to the position of an upper electrode. A Cu film is formed so as to fill the opening corresponding to the upper electrode, and the resist is removed. Thereby, the upper electrode is formed. An interconnection (not shown) electrically connected to the upper electrode is provided.

A method for manufacturing the magnetic memory element 112bs illustrated in FIG. 11 will now be described.

First, a lower electrode (not shown) is formed on a wafer, and then the wafer is placed in an ultrahigh vacuum sputter apparatus. Next, on the lower electrode, a Ta\Ru layer (a contact layer for contact with an electrode, also functioning as a stopper layer), an FePd\CoFeB layer (the second ferromagnetic layer of the magnetic memory unit), MgO (the first nonmagnetic layer), a CoFeB\FePt layer (the first ferromagnetic layer of the magnetic memory unit), Ru (the third nonmagnetic layer), an FePt\CoFeB\Cu\Py layer (the magnetic field generation unit), and a layer of Ta (a contact layer for contact with an electrode) thereon are stacked in this order. Here, the strength of the magnetic anisotropy in the film surface perpendicular direction of the FePd\CoFeB layer and the CoFeB\FePt layer can be adjusted by annealing in a magnetic field.

Next, an EB resist is applied to perform EB exposure to form a resist mask with a diameter of 50 nm. Ion milling is performed to remove the portions not covered with the resist until the Ta layer on the lower electrode also functioning as a stopper layer becomes exposed.

Subsequently, a SiN layer is formed as the protection layer 52, and then a Py layer functioning as the magnetic shield 51 is formed. Etchback is performed to leave the Py layer on the side wall of the magnetic memory element.

Next, a $SiO_2$ film is deposited in order to perform insulating embedding on the magnetic memory element, then planarization is performed by CMP or the like, and then RIE or the like is performed to etch the entire surface to expose the contact layer for contact with an electrode.

Further, a resist is applied to the entire surface, and a stepper exposure apparatus is used to perform patterning on the resist so that a portion not covered with the resist may be created in the position of the upper electrode. Cu is deposited to fill the opening corresponding to the upper electrode, and the resist is removed. A not-shown interconnection is provided to the upper electrode to allow electrical input and output.

Second Embodiment

Figure 16:
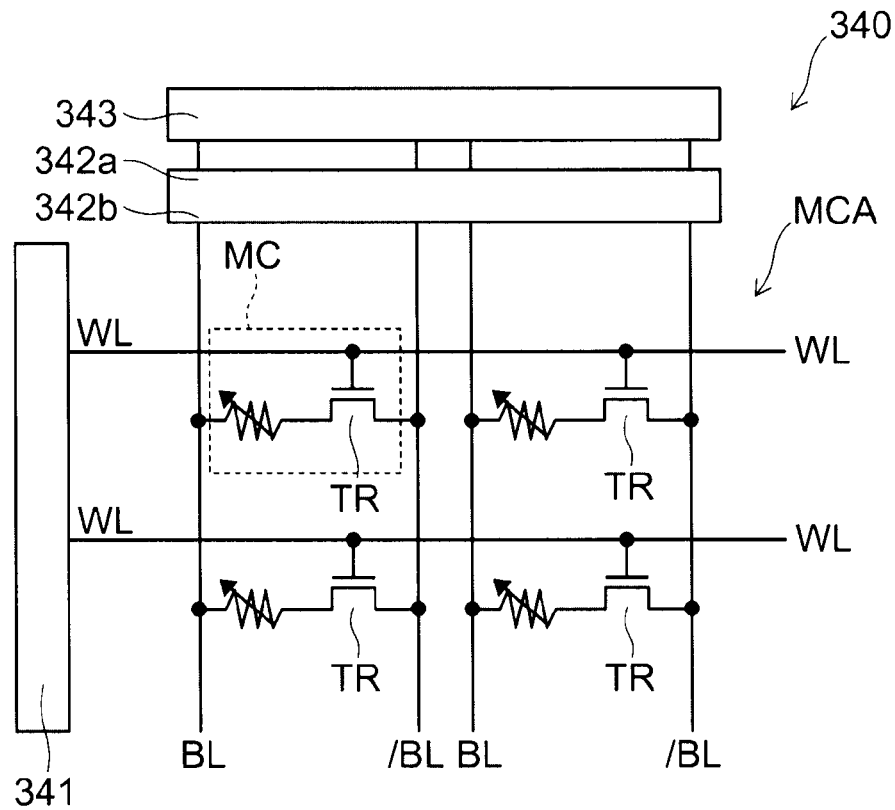
FIG. 16 is a schematic view illustrating the configuration of a nonvolatile memory device according to a second embodiment.

FIG. 16 is a schematic view illustrating the configuration of a nonvolatile memory device according to a second embodiment.

As shown in FIG. 16, a nonvolatile memory device 340 according to the embodiment includes a memory cell array MCA. The memory cell array MCA includes a plurality of memory cells MC arranged in a matrix configuration.

Each memory cell MC includes one of the magnetic memory elements according to the first embodiment as an MTJ element (the stacked body SB0).

In the memory cell array MCA, a plurality of bit line pairs (a bit line BL and a bit line/BL) and a plurality of word lines WL are arranged. Each of the plurality of bit line pairs extends in the column direction. Each of the plurality of word lines WL extends in the row direction.

The memory cell MC is placed at the intersection of the bit line BL and the word line WL. Each memory cell MC includes the MTJ element and a selection transistor TR. One end of the MTJ element is connected to the bit line BL. The other end of the MTJ element is connected to the drain terminal of the selection transistor TR. The gate terminal of the selection transistor TR is connected to the word line WL. The source terminal of the selection transistor TR is connected to the bit line/BL.

A row decoder 341 is connected to the word line WL. A write circuit 342a and a read circuit 342b are connected to the bit line pair (the bit line BL and the bit line/BL). A column decoder 343 is connected to the write circuit 342a and the read circuit 342b.

Each memory cell MC is selected by the row decoder 341 and the column decoder 343. An example of the data writing to the memory cell MC is as follows. First, to select a memory cell MC to perform data writing on, the word line WL connected to the memory cell MC is activated. Thereby, the selection transistor TR is switched to ON.

A bidirectional write current, for example, is supplied to the MTJ element. Specifically, in the case where a write current is supplied to the MTJ element from left to right, the write circuit 342a applies a positive potential to the bit line BL and applies the ground potential to the bit line/BL. In the case where a write current is supplied to the MTJ element from right to left, the write circuit 342a applies a positive potential to the bit line/BL and applies the ground potential to the bit line BL. Thus, data "0" or data "1" can be written to the memory cell MC.

An example of the data reading from the memory cell MC is as follows. First, a memory cell MC is selected. The read circuit 342b supplies, for example, a read current flowing in a direction from the selection transistor toward the MTJ element. Then, the read circuit 342b detects the resistance value of the MTJ element based on this read current. Thus, the information stored in the MTJ element can be read out.

Figure 17:
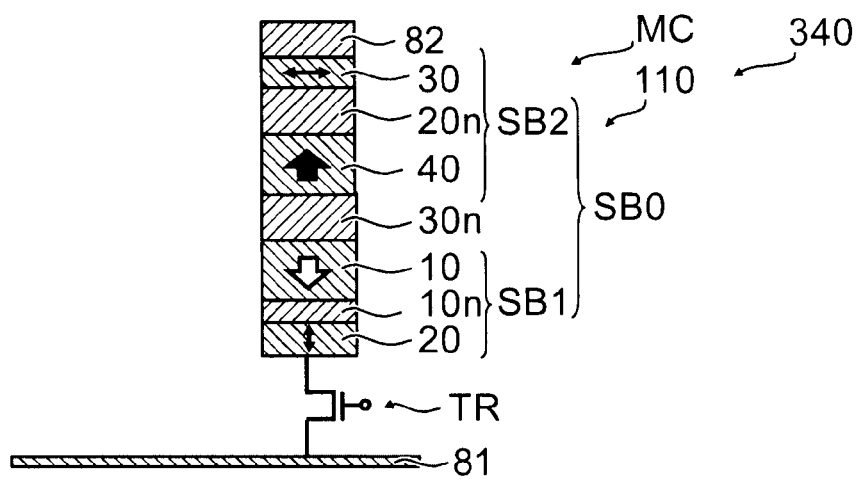
FIG. 17 is a schematic view illustrating the configuration of the nonvolatile memory device according to the second embodiment.

FIG. 17 is a schematic view illustrating the configuration of the nonvolatile memory device according to the second embodiment.

FIG. 17 illustrates the portion of one memory cell MC. Although the magnetic memory element 110 is used in this example, any magnetic memory element according to the embodiment may be used.

As shown in FIG. 17, the nonvolatile memory device 340 includes the magnetic memory element according to the embodiment (e.g. the magnetic memory element 110), a first interconnection 81, and a second interconnection 82. The first interconnection 81 is directly or indirectly connected to one end of the magnetic memory element 110 (e.g. the end of the first stacked unit SB1). The second interconnection 82 is directly or indirectly connected to the other end of the magnetic memory element 110 (e.g. the end of the second stacked unit SB2).

Herein, "directly connected" includes a state of being electrically connected with no other conductive member (e.g. a via electrode, an interconnection, etc.) interposed therebetween. "Indirectly connected" includes a state of being electrically connected with another conductive member (e.g. a via electrode, an interconnection, etc.) interposed therebetween and a state of being connected in a state where a switch (e.g. a transistor, etc.) is interposed therebetween to enable switching between conduction and non-conduction.

One of the first interconnection 81 and the second interconnection 82 corresponds to, for example, the word line WL. The other of the first interconnection 81 and the second interconnection 82 corresponds to, for example, the bit line BL or the bit line /BL.

As shown in FIG. 17, the nonvolatile memory device 340 may further include the selection transistor TR. The selection transistor TR is provided at least one of between the magnetic memory element 110 and the first interconnection 81 (a first position) and between the magnetic memory element 110 and the second interconnection 82 (a second position). Thereby, the operations described in regard to FIG. 16 can be performed.

The embodiment provides a magnetic memory element and a nonvolatile memory device capable of stable operation.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of magnetic memory elements such as ferromagnetic layers, nonmagnetic layers, and electrodes and components of nonvolatile memory devices such as interconnections and transistors from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory elements and nonvolatile memory devices that can be obtained by an appropriate design modification by one skilled in the art based on the magnetic memory elements and the nonvolatile memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory element comprising: a stacked body,
the stacked body including:
a first stacked unit including:
a first ferromagnetic layer, a magnetization of the first ferromagnetic layer being fixed in a first direction having a component perpendicular to a film surface of the first ferromagnetic layer;
a second ferromagnetic layer stacked with a first ferromagnetic layer along a stacking direction, a direction of a magnetization of the second ferromagnetic layer being variable in directions perpendicular to a film surface of the second ferromagnetic layer; and
a first nonmagnetic layer provided between the first ferromagnetic layer and the second ferromagnetic layer; and
a second stacked unit stacked with the first stacked unit along the stacking direction, the second stacked unit including:
a third ferromagnetic layer, a direction of a magnetization of the third ferromagnetic layer being variable in directions parallel to a film surface of the third ferromagnetic layer;
a fourth ferromagnetic layer stacked with the third ferromagnetic layer along the stacking direction, a magnetization of the fourth ferromagnetic layer being fixed in a second direction having a component perpendicular to a film surface of the fourth ferromagnetic layer; and
a second nonmagnetic layer provided between the third ferromagnetic layer and the fourth ferromagnetic layer,
a stray magnetic field Hs (Oe) from the first ferromagnetic layer, the second ferromagnetic layer, and the fourth ferromagnetic layer in a position of the third ferromagnetic layer, a magnetic anisotropy Ku (erg/cm$^3$) of the third ferromagnetic layer, a damping coefficient α of the third ferromagnetic layer, a magnetization Ms (emu/cc) of the third ferromagnetic layer, and a demagnetic field coefficient Nz of the third ferromagnetic layer satisfying a relationship of $$K_u < \alpha M_s (8\pi N_z M_s - H_s),$$ and the direction of the magnetization of the second ferromagnetic layer being set to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer.

2. The element according to claim 1, wherein the first direction is opposite to the second direction.

3. The element according to claim 1, wherein
the stacked body further includes a third nonmagnetic layer provided between the first stacked unit and the second stacked unit and
the third nonmagnetic layer contains a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group.

4. The element according to claim 1, wherein
the stacked body further includes a third nonmagnetic layer provided between the first stacked unit and the second stacked unit,
the third nonmagnetic layer contains a metal selected from the group consisting of ruthenium (Ru), osmium (Os), and iridium (Ir) or an alloy including at least two selected from the group, and
a thickness of the third nonmagnetic layer is not more than 3 nanometers.

5. The element according to claim 1, wherein the stray magnetic field Hs (Oe), the magnetic anisotropy Ku (erg/cm$^3$) of the third ferromagnetic layer, the damping coefficient α of the third ferromagnetic layer, the magnetization Ms (emu/cc) of the third ferromagnetic layer, and the demagnetic field coefficient Nz of the third ferromagnetic layer satisfy a relationship of $$K_u < \alpha M_s(0.4 \times 8\pi N_z M_s - H_s).$$

6. The element according to claim 1, wherein the stray magnetic field Hs (Oe), the magnetic anisotropy Ku (erg/cm$^3$) of the third ferromagnetic layer, the damping coefficient α of the third ferromagnetic layer, the magnetization Ms (emu/cc) of the third ferromagnetic layer, the demagnetic field coefficient Nz of the third ferromagnetic layer, a volume V (cm$^3$) of the third ferromagnetic layer, and a read current $I_R$ (A) passed through the third ferromagnetic layer in a read operation satisfy a relationship of $$\frac{\hbar}{2e} \cdot \frac{g(\theta)}{V} \cdot I_R + \alpha(H_s - 4\pi N_z M_z) \le K_u \le \alpha M_s(0.4 \times 8\pi N_z M_s - H_s)$$

$$\hbar - h/2\pi,$$

where h is a Planck constant (erg·s), e is an elementary electric charge (A·second), θ is an angle (rad) between the direction of the magnetization of the third ferromagnetic layer and the stacking direction, and g(θ) is a parameter representing an efficiency of spin transfer depending on a spin polarization degree.

7. The element according to claim 1, wherein the stray magnetic field Hs (Oe), the magnetic anisotropy Ku (erg/cm$^3$) of the third ferromagnetic layer, the damping coefficient α of the third ferromagnetic layer, the magnetization Ms (emu/cc) of the third ferromagnetic layer, the demagnetic field coefficient Nz of the third ferromagnetic layer, a volume V (cm$^3$) of the third ferromagnetic layer, and a read current $I_R$ (A) passed through the third ferromagnetic layer in a read operation satisfy a relationship of $$\frac{\hbar}{2e} \cdot \frac{g(\theta)}{V} \cdot I_R \le K_u \le \alpha M_s(0.4 \times 8\pi N_z M_s - H_s)$$

$$\hbar - h/2\pi,$$

where h is a Planck constant (erg·s), e is an elementary electric charge (A·s), θ is an angle (rad) between the direction of the magnetization of the third ferromagnetic layer and the stacking direction, and g(θ) is a parameter representing an efficiency of spin transfer depending on a spin polarization degree.

8. The element according to claim 1, further comprising a magnetic shield facing at least a part of a side surface of the stacked body.

9. The element according to claim 1, wherein
the first ferromagnetic layer is disposed between the second ferromagnetic layer and the fourth ferromagnetic layer,
the fourth ferromagnetic layer is disposed between the first ferromagnetic layer and the third ferromagnetic layer and
a third nonmagnetic layer is disposed between the first ferromagnetic layer and the fourth ferromagnetic layer.

10. The element according to claim 1, wherein
the second ferromagnetic layer is disposed between the first ferromagnetic layer and the third ferromagnetic layer,
the third ferromagnetic layer is disposed between the second ferromagnetic layer and the fourth ferromagnetic layer and
a third nonmagnetic layer is disposed between the second ferromagnetic layer and the third ferromagnetic layer.

11. The element according to claim 1, wherein
the second ferromagnetic layer is disposed between the first ferromagnetic layer and the fourth ferromagnetic layer,
the fourth ferromagnetic layer is disposed between the second ferromagnetic layer and the third ferromagnetic layer and
a third nonmagnetic layer is disposed between the second ferromagnetic layer and the fourth ferromagnetic layer.

12. The element according to claim 1, wherein
the first ferromagnetic layer is disposed between the second ferromagnetic layer and the third ferromagnetic layer,
the third ferromagnetic layer is disposed between the first ferromagnetic layer and the fourth ferromagnetic layer and
a third nonmagnetic layer is disposed between the first ferromagnetic layer and the third ferromagnetic layer.

13. A nonvolatile memory device comprising:
a magnetic memory element including a stacked body, a first electrode connected to the stacked body, and a second electrode connected to the stacked body,
the stacked body including:
a first stacked unit including:
a first ferromagnetic layer, a magnetization of the first ferromagnetic layer being fixed in a first direction having a component perpendicular to a film surface of the first ferromagnetic layer;
a second ferromagnetic layer stacked with first ferromagnetic layer along a stacking direction, a direction of a magnetization of the second ferromagnetic layer being variable in directions perpendicular to a film surface of the second ferromagnetic layer; and a first nonmagnetic layer provided between the first ferromagnetic layer and the second ferromagnetic layer; and a second stacked unit stacked with the first stacked unit along the stacking direction, the second stacked unit including:

a third ferromagnetic layer, a direction of a magnetization of the third ferromagnetic layer being variable in directions parallel to a film surface of the third ferromagnetic layer;

a fourth ferromagnetic layer stacked with the third ferromagnetic layer along the stacking direction, a magnetization of the fourth ferromagnetic layer being fixed in a second direction having a component perpendicular to a film surface of the fourth ferromagnetic layer; and a second nonmagnetic layer provided between the third ferromagnetic layer and the fourth ferromagnetic layer, a stray magnetic field Hs (Oe) from the first ferromagnetic layer, the second ferromagnetic layer, and the fourth ferromagnetic layer in a position of the third ferromagnetic layer, a magnetic anisotropy Ku (erg/cm³) of the third ferromagnetic layer, a damping coefficient α of the third ferromagnetic layer, a magnetization Ms (emu/cc) of the third ferromagnetic layer, and a demagnetic field coefficient Nz of the third ferromagnetic layer satisfying a relationship of $K_u < \alpha M_s (8\pi N_z M_s - H_s)$, and the direction of the magnetization of the second ferromagnetic layer being set to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer;

a first interconnection directly or indirectly connected to the first electrode of the magnetic memory element; and a second interconnection directly or indirectly connected to the second electrode of the magnetic memory element, the first and second interconnections being configured to flow the current though the stacked body along the stacking direction.

14. The device according to claim 13 further comprising a selection transistor provided at least one of position between the first electrode and the first interconnection and a position between the second electrode and the second interconnection.

15. The device according to claim 13, wherein the first direction is opposite to the second direction.

16. The device according to claim 13, wherein the stacked body further includes a third nonmagnetic layer provided between the first stacked unit and the second stacked unit and the third nonmagnetic layer contains a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group.

17. The device according to claim 13, wherein the stacked body further includes a third nonmagnetic layer provided between the first stacked unit and the second stacked unit, the third nonmagnetic layer contains a metal selected from the group consisting of ruthenium (Ru), osmium (Os), and iridium (Ir) or an alloy including at least two selected from the group, and a thickness of the third nonmagnetic layer is not more than 3 nanometers.

18. The device according to claim 13, wherein the stray magnetic field Hs (Oe), the magnetic anisotropy Ku (erg/cm³) of the third ferromagnetic layer, the damping coefficient α of the third ferromagnetic layer, the magnetization Ms (emu/cc) of the third ferromagnetic layer, and the demagnetic field coefficient Nz of the third ferromagnetic layer satisfy a relationship of $K_u < \alpha M_s (0.4 \times 8\pi N_z M_s - H_s)$.

19. The device according to claim 13, wherein the stray magnetic field Hs (Oe), the magnetic anisotropy Ku (erg/cm³) of the third ferromagnetic layer, the damping coefficient α of the third ferromagnetic layer, the magnetization Ms (emu/cc) of the third ferromagnetic layer, the demagnetic field coefficient Nz of the third ferromagnetic layer, a volume V (cm³) of the third ferromagnetic layer, and a read current $I_R$ (A) passed through the third ferromagnetic layer in a read operation satisfy a relationship of $$\frac{\hbar}{2e} \cdot \frac{g(\theta)}{V} \cdot I_R + \alpha(H_s - 4\pi N_z M_z) \le K_u \le \alpha M_s (0.4 \times 8\pi N_z M_s - H_s)$$

$\hbar - h/2\pi$, where h is a Planck constant (erg·s), e is an elementary electric charge (A·second), θ is an angle (rad) between the direction of the magnetization of the third ferromagnetic layer and the stacking direction, and g(θ) is a parameter representing an efficiency of spin transfer depending on a spin polarization degree.

20. The device according to claim 13, wherein the stray magnetic field Hs (Oe), the magnetic anisotropy Ku (erg/cm³) of the third ferromagnetic layer, the damping coefficient α of the third ferromagnetic layer, the magnetization Ms (emu/cc) of the third ferromagnetic layer, the demagnetic field coefficient Nz of the third ferromagnetic layer, a volume V (cm³) of the third ferromagnetic layer, and a read current $I_R$ (A) passed through the third ferromagnetic layer in a read operation satisfy a relationship of $$\frac{\hbar}{2e} \cdot \frac{g(\theta)}{V} \cdot I_R \le K_u \le \alpha M_s (0.4 \times 8\pi N_z M_s - H_s)$$

$\hbar - h/2\pi$, where h is a Planck constant (erg·s), e is an elementary electric charge (A·s), θ is an angle (rad) between the direction of the magnetization of the third ferromagnetic layer and the stacking direction, and g(θ) is a parameter representing an efficiency of spin transfer depending on a spin polarization degree.

* * * * *